United States Patent [19]
Sridhar et al.

[11] Patent Number: 5,796,624
[45] Date of Patent: Aug. 18, 1998

[54] METHOD AND APPARATUS FOR DESIGNING CIRCUITS FOR WAVE PIPELINING

[75] Inventors: Ramalingam Sridhar, East Amherst, N.Y.; Zhang Xuguang, Cerritos, Calif.

[73] Assignee: Research Foundation of State University of New York, Amherst, N.Y.

[21] Appl. No.: 796,395

[22] Filed: Feb. 6, 1997

Related U.S. Application Data

[62] Division of Ser. No. 620,466, Mar. 22, 1996, Pat. No. 5,701,094, which is a division of Ser. No. 307,932, Sep. 16, 1994, Pat. No. 5,528,177.

[51] Int. Cl.$^6$ .................................................. G06F 15/00
[52] U.S. Cl. .................. 364/489; 364/490; 364/491; 364/488; 364/91; 326/113; 326/119
[58] Field of Search .................. 364/488, 489, 364/490, 491; 326/91, 21, 23, 24, 44, 45, 49, 50, 112, 113, 81, 87, 85, 119, 121; 257/206

[56] References Cited

U.S. PATENT DOCUMENTS

| | | | |
|---|---|---|---|
| 3,943,378 | 3/1976 | Beutler | 307/220 |
| 4,541,067 | 9/1985 | Whitaker | 364/784 |
| 4,559,609 | 12/1985 | Robinson et al. | 365/784 |
| 4,607,176 | 8/1986 | Burrows et al. | 307/451 |
| 4,620,117 | 10/1986 | Fang | 307/443 |
| 4,710,649 | 12/1987 | Lewis | 307/443 |
| 5,200,907 | 4/1993 | Tran | 364/488 |
| 5,528,177 | 6/1996 | Sridhar et al. | 326/113 |
| 5,701,094 | 12/1997 | Sridhar et al. | 326/113 |

OTHER PUBLICATIONS

Akers, S.B., "Binary decision diagrams", *IEEE Transactions on Computers*, C–27,, 509–516, (Jun. 1978).

Anderson, S.F., et al., "The IBM system/360 Model 91: Floating–Point execution Unit", *IBM J. of Reseach and Development*, 11,, pp. 34–53, (Jan. 1967).

Bryant, R., "Graph–Based algorithms for boolean function manipulation", *IEEE Transactions on computers*, vol. C–35, No. 8,, 677–691, (Aug. 1986).

Cotten, L.W., "Maximum–rate pipeline systems AFIPS Conference Proceedings,", *1969 Spring Joint Computer Conference*, 34,, pp. 581–586, (May 14–16, 1969).

Ekroot, B.C., "Optimization of pipelined processors by insertation of combinational logic delay", Dissertation, Stanford University, (1987).

Fan, D., et al., "A CMOS parallel adder using wave piplining", *Advanced Research in VLSI and Parallel Systems, Proceedings of the 1992 Brown/MIT conference*, 147–164, (1992).

Flynn, M., et al., "Subnanosecond arithmetic", *Abstract for 1990–1993*,, computer systems laboratory, Stanford University,, i–13, (May 1993).

Ghosh, D., et al., "A 400 MHZ wave–pipelined 8×8 bit multiplier in CMOS technology", *IEEE*, 198–201, (1993).

Joy, D., et al., "Placement for clock period minimization with multiple wave propation", *Proceedings of the 28th ACM/IEEE Design automation conference*,, pp. 640–643, (Jun. 17–21, 1991).

(List continued on next page.)

*Primary Examiner*—Edward R. Cosimano
*Assistant Examiner*—Vuthe Siek
*Attorney, Agent, or Firm*—Schwegman, Lundberg, Woessner & Kluth, P.A.

[57] ABSTRACT

A family of CFET logic circuits useful for wave-pipeline systems is described, and a method to design same. The invention uses complementary transmission gates and pull-up or pull-down transistors to achieve a family of CFET logic circuits which include AND, NAND, OR, NOR, XOR, XNOR, select, select-invert, invert, and not-invert functions. Each circuit is tuned to provide substantially equal delays, high-quality ones and zeros, and substantially equal rise and fall times, for every combination of input-state transition and output-state transition.

28 Claims, 23 Drawing Sheets

OTHER PUBLICATIONS

Karplus, K., "Amap: a technology mapper for selector-based field-programmable gate arrays", *Proceedings of the 28th ACM/IEEE Design automation conference,* 244–247, (Jun. 17–21, 1991).

Klass, F., et al., "Fast multiplication of VLSI using wave pipelining techniques", *J. of VLSI signal Processing,* 7,, 233–248, (May 1994).

Klass, F., et al., "Pushing the limits of CMOS technology: a wave–pipelined multiplier", *Hot Chips V,* 1–22, (Aug. 1993).

Klass, F., et al., "Use of CMOS technology in wave pipelining section computer architecture and digital systems", *IEEE,* Delft University of Technology,, 303–308,, (1991).

Lam, W.K., et al., "Valid clocking in wavepiplined circuits", *1992 IEEE/ACM International Conference on Computer–aded design, digest of technical papers,,* 518–525, (Nov. 8–12, 1992).

Shimohigashi, K., et al., "Low Voltage ULSI Design", *IEEE J. of Solid–State Circuits,* 28, No. 4,, 408–413, (Apr. 1993).

Weste, N.H., et al., "Principles of CMOS VLSI Design –a systems perspective", Addison–Wesley pbulishing company, 2nd ed., AT&T, (1993).

Wong, D.C., et al., "Designing high performance digital circuits using wave piplining: Algorithms and practical experiences", *IEEE Transactions on Computer–aided design of integrated circuits and systems,* vol. 12, No. 1, pp. 25–46, (Jan. 1993).

Wong, D., "Techniques for designing high–performance digital circuits using wave pipeline", Dissertation, Stanford University,, (1991).

Yano, K., et al., "A 3.8–ns CMOS 16×16–b multiplier using complementary pass–transistor logic", *IEEE J. of Solid–State Circuits,* vol. 25, No. 2, pp. 388–395, (Apr. 1990).

Zhang, X., et al., "CMOS wave pipelining by complementary pass–transistor logic", *Dept. of Electrical and Computer Engineering,,* 1–12, (Jul. 24, 1993).

Wong et al "WP 3.6: A Bipolar Population Counter Using Wave Pipeling to Achieve 2.5X Normal Clock Frequency," IEEE, pp. 56–57, Feb. 1992.

Wong et al "Designing High–Performance Digital Circuits Using Wave Pipelining: Algrorithms and Practical Experiences," IEEE, pp. 25–46, Jan. 1993.

Ghosh et al "A 400MHZ Wave–Pipelined 8×8–BIT Multiplier in CM OS Technology," IEEE, pp. 198–201, Oct. 1993.

Mehrotra et al "Skew and Delay Minimization of High Speed CMOS Circuits Using Stochastic Optimization," IEEE, pp. 245–248, May 1994.

Klass et al "A 16×16–BIT Static CMOS Wave–Pipelined Multiplier," IEEE, pp. 143–146, Jun. 1994.

Zhang et al "Synchronization of Wave–Pipelined Circuits," IEEE, pp. 164–167, Oct. 1994.

Zhang et al "CMOS Wave Pipelining Using Transmission–Gate Logic," IEEE, pp. 92–95, Sep. 1994.

Liu et al "A 250–MHZ Wave Pipelined Adder in 2–um CMOS," IEEE, pp. 1117–1128, Sep. 1994.

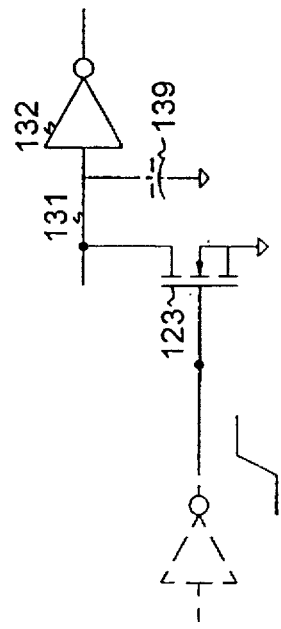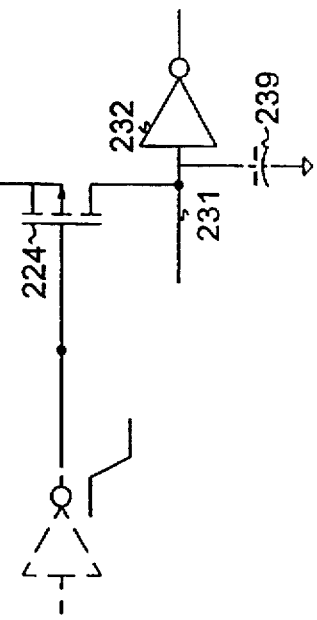

METHOD AND APPARATUS FOR DESIGNING CIRCUITS FOR WAVE PIPELINING

This application is a divisional of of U.S. Ser. No. 08/620,466 filed Mar. 22, 1996, now U.S. Pat. No. 5,701,094, which is a divisional of U.S. Ser. No. 08/307,932 filed of Sep. 16, 1994, now U.S. Pat. No. 5,528,177 issued Jun. 18, 1996.

FIELD OF THE INVENTION

The present invention relates to digital logic circuits and more specifically to Complementary Field-Effect Transistor logic circuits suitable for wave pipelining.

BACKGROUND OF THE INVENTION

Conventional Complementary Field-Effect Transistors ("CFET") logic circuits include N-channel field-effect transistors ("NFET") and P-channel field-effect transistors ("PFET"). In the following description the terms CFET, NFET, and PFET should be interpreted to include all field-effect transistor integrated circuit technologies. Metal-Oxide Semiconductor ("MOS") processes are often used to fabricate Field-Effect Transistors ("FET") logic circuits. As used in this description, the terms MOS and FET are interchangeable.

Conventional logic-circuit-design techniques contemplate increasing the throughput of a system with a "pipeline". The pipeline comprises a number of logic sections, each separated by a register section. Each system clock transition allows a "data signal" (herein also simply called "signal") to propagate from one register section, through the following logic section, and to the inputs of the following register section. Typically, new signal inputs are not fed into a logic section until the previous signal outputs are latched into the register section following that logic section. The maximum clock frequency for a logic section (i.e., the frequency with which new data can be switched into a logic section) is limited by the maximum propagation delay of a path through that logic section.

One way of increasing system throughput is to break up logic sections into smaller sections (each with a shorter propagation delay) and insert pipeline register-section levels to separate the smaller logic sections. The clock speed can then be increased to take advantage of the shorter logic-section delays.

This "pipelining" technique has been used to obtain significant speed-up of a computer system. FIG. 1a illustrates conventional pipelining, showing the edges of signals propagating though small combinational-logic blocks. Conventionally, a combinational-logical-function unit is partitioned into several smaller combinational-logic blocks, and register stages are inserted between adjacent combinational-logic blocks as the synchronizers. However, the inserted register stages contribute to increased physical area and added clock-distribution requirements, resulting in a limitation on performance.

The increasing demand for high-speed, compact devices and systems, and the limitations of existing design methods, have prompted researchers to look for alternate techniques that can lead to high-performance digital systems. One such method is called "wave pipelining". Wave pipelining eliminates intermediate register stages in a pipeline system by using the internal capacitance of a combinational block for storage. Wave-pipelined systems do, however, have strict requirements on (a) the uniformity of path delays, (b) uniformity of output-signal rise and fall times, and (c) the independence of delay from the pattern of input signal transitions.

FIG. 1b shows one embodiment of a wave-pipelining technique. In FIG. 1b, the internal capacitances in the combinational logic act in effect as temporary storage elements. These dynamic storage elements take the place of static registers used in the conventional pipelining method shown in FIG. 1a. Under the approach shown in FIG. 1b, new data values are latched in before the previous data values propagate to the next set of registers. In this way, there are multiple coherent data "waves" within the combinational-logic block. Hence, the system clock is much faster than the propagation delay of the combinational-logic block between adjacent system-clocked-register stages.

The concept of wave pipelining (also called "maximum-rate pipelining") was first described by Cotten [Cotten:69] and Anderson, et al. [Anderson:67], and was applied in the design of IBM360/91 floating-point execution unit in the 1960's. The significant advantages of wave pipelining are:

(1) Achieving very high pipeline rates that approach the physical speed limit of the technology;

(2) Increasing pipeline rate without significant latency increase;

(3) Minimizing clock loading and reducing clock-distribution problems; and (4) Using fewer registers and reducing the area overhead otherwise required by conventional pipelining.

To obtain a high operating speed, each path through a given functional block must have similar path delays. This requires symmetric rise and fall times (collectively called "transition" times) of output signals, and, for each component within the logical-functional block, delays that are independent of the input-signal transition patterns. Wave-pipelined systems are susceptible to process and environmental variations which will cause propagation-delay-variation problems [Klass:93b].

Recently, with the demanding digital system speed and throughput requirements of various applications, wave-pipelining has received considerable attention from many research groups [Wong:93] [Fan:92] [Klass:92] [Zhang:93]. In addition, Ekroot [Ekroot:87] developed a theory of wave pipelining and a linear program to insert delay elements to balance the circuit with the assumptions of fixed gate- and module delays.

Wong et al. [Wong:93] [Wong:91] continued their initial research and developed the algorithms to automatically equalize delays in bipolar combinational logic circuits to achieve a high degree of wave pipelining. These authors have also reported the results of a 63-bit population counter using CML (Common-Mode Logic) bipolar technology, and discussed the limitations of using standard CMOS technology for wave pipelining.

Fan et al. [Fan:92], and Klass and Mulder [Klass:92] studied the use and limitations of CMOS technology for wave pipelining. They designed wave-pipelined CLA (Carry Look-Ahead) adders and showed performance improvement over conventional methods.

Lam et al. [Lam:92] analyzed valid clocking in wave-pipelined circuits using Timed Boolean Functions.

Joy and Ciesieski [Joy:91] have proposed certain physical placement of components and specific routing algorithms for laying out wave-pipelined circuits. Klass, Flynn and Goor reported the design of a fast CMOS wave-pipelined multiplier [Klass:93b] [Klass:93a].

The timing constraints of wave-pipelined circuits have been carefully studied and discussed by several research groups. In summary, for a wave-pipelined system using edge-triggered registers, the minimum clock-period relation should be [Cotten:69] [Klass:92] [Wong:91]:

$$t_{cp} > Max\{(\Delta t_p + (2*\Delta C) + t_s + t_h + t_{rf}), (\Delta t_x + \Delta C + t_{ms} + t_{rf})\} \quad \{\text{Equation 1}\}$$

where the variables are defined as $t_{cp}$ is the valid clock period, $\Delta t_p$ is the maximum time difference between the longest and shortest paths for the worst-case design, $\Delta C$ is the worst-case clock skew, $t_s$ is the setup time for registers, $t_h$ is the hold time for registers, $t_{rf}$ is the worst-case rise/fall time at the last logic stage, $\Delta t_x$ is the maximum time difference between the longest and shortest path from the global inputs to an internal signal node X, and $t_{ms}$ is the minimum stable time for X to insure the correct operation of the next logic stage.

Both transition times and signal-propagation delays must be constrained to avoid data wave interference. The clock period time limit to prevent interference of a data wave with any previous data wave at the ending storage element of a wave-pipelined logic section is bounded by $t_{cp} > (\Delta t_p + (2*\Delta C) + t_s + t_h + t_{rf})$. The clock period time limit to prevent interference of a data wave with any previous data wave inside a section of combinational logic is bounded by $t_{cp} > (\Delta t_x + \Delta C + t_{ms} + t_{rf})$.

To achieve maximum wave-pipeline rate, designers should minimize $t_{cp}$ in Equation 1. Here, it is assumed that the clock skew $\Delta C$ can be minimize by conventional design techniques, and that the terms $t_s$, $t_h$, $t_{rf}$, and $t_{ms}$ are technology-dependent parameters and specific to a certain logic stage, so they can be optimized individually. The remaining terms, $\Delta t_p$ and $\Delta t_x$, arise from the following possible sources:

(1) path differences due to practical circuit configurations, (2) data-dependent signal-delay variations, and (3) process- and temperature-induced variations.

As some process- and temperature-induced variations are unavoidable, the focus should be on the path differences that are due to practical circuit configurations and data-dependent delay variations. Therefore, if possible, a wave-pipelined circuit should be designed to have balanced paths (in terms of the basic logic gates and delay elements) in order to keep $\Delta t_p$ and $\Delta t_x$ as close to zero as possible.

Unfortunately, most practical digital circuits do not have such balanced configurations. Therefore, specific algorithms have been suggested for designing practical wave-pipelined circuits by inserting delay elements ("rough tuning") and adjusting gate-driving abilities ("fine tuning") [Wong:93] [Wong:89].

Even for a balanced circuit, the data-dependent delay variations of logic gates an still contribute to the values of $\Delta t_p$ and $\Delta t_x$. This fact establishes that, from the viewpoint of circuit designers, the minimum clock period is eventually bounded by the delay variations of the basic logic circuit used in a wave-pipelined system. Therefore, the choice of the circuit family for the wave-pipelined system design can have a significant impact on performance through the effect of delay variations at the gate level. A set of ideal properties of the basic circuits for wave pipelining can be summarized as follows:

(1) same gate delay for both rising and falling edges of output signal, (2) no variation in the gate delay due to different input patterns, and (3) no variation in the gate delay due to different previous input patterns.

By examining these requirements, it was found that bipolar circuit families (Emitter-Coupled Logic ("ECL"), super-buffered ECL, and Common-Mode Logic ("CML")) are good candidates for wave pipelining [Wong:93]. Standard CMOS was not well suited for this technique, since CMOS gate delay depends strongly on the input patterns or different signal timing patterns [Klass:92] [Fan:92]. For example, the standard prior-art two-input CMOS NAND gate 10 shown in FIG. 1c has two transistors in parallel (21 and 22) and two transistors in series (23 and 24). The physical characteristics of transistors 23 and 24 can be designed so together they pull output 31 down to a logic "zero" at a rate corresponding to the rate that transistors 21 and 22 together can pull output 31 up to a logic "one". In such an embodiment, if input signals 11 and 12 both start at "one", and both switch to "zero", transistor 21 and transistor 22 will both switch, driving output 31 from ground potential 14 to $V_{DD}$ "zero" (e.g., input 11), only a single transistor (e.g., transistor 21) will pull output 31 to $V_{DD}$ voltage 15. Since there is some capacitance associated with output 31, when both transistors 21 and 22 are pulling output 31, output 31 will switch faster than if either transistor 21 or 22 alone is driving output 31. Therefore, in CFET NAND gates, rise times vary as a function of the input state transitions.

Since CMOS technology is a dominant and mature technology in the modern semiconductor industry, and has certain unique positive features for digital system design, it is necessary to attack the practical problems of unequal delays and asymmetric rise and fall times and to explore novel design techniques that are suitable for CMOS wave pipelining. Researchers have studied the basic logic-circuit issues of CMOS wave-pipelining technique and have proposed some solutions. For instance, in [Fan:92] and [Gray:91], the basic logic circuits used are an inverter (not shown) and a two-input cross-coupled pseudo-NMOS NAND gate 40 (shown in FIG. 1d), which is formed by stacking cross-coupled n-channel transistors under a p-channel active pull-up device with bias voltage Vb. Since, however, the bias voltage Vb has to be distributed all over the wave-pipelined circuit chip, and the gate delay is sensitive to the bias-voltage value, careful routing is needed to insure proper functioning of the circuit [Fan:92].

In an alternative approach, a balanced CMOS NAND gate (FIG. 1e) is proposed in [Klass:92] to reduce the static CMOS gate-delay variations by adding a redundant ground-biased PMOS device to "soften" the input-pattern-dependent delay variation. This approach, however, has the drawbacks of increased layout area, loading capacitance, gate delays and dynamic power dissipation.

Klass [Klass:93a] describes a wave-pipelining circuit using standard CMOS logic gates. In [Klass:93b] and [Klass:93a], a conventional static CMOS NAND gate and an invertor were used as the basic circuits; however, the design was restricted to use 2-input NAND gates and invertors for every logic function, to minimize the delay sensitivity of the circuit to the input data patterns. In addition, every function block had to be verified separately to avoid large delay variations.

Each of the above approaches use only 2-input NAND gates and invertors as the basic circuits to implement arbitrary logic functions. This constraint can lead to a large chip area, and will limit the applications of wave pipelining.

Wong [Wong:93] presents an algorithm for designing a wave-pipelining circuit with minimal area and minimal power consumption. The algorithm involves: (1) rough tuning, by adding delay elements to balance circuit paths; and (2) fine tuning, by adjusting gate drives to compensate for delay variations introduced by different "fanouts" (the number of loads; in CFET technology this is primarily the sum of the capacitive load of each gate driven by the output driver, plus the capacitance of inter-circuit wiring).

Other FET logic families have also been explored. For instance, Complementary Pass-transistor Logic ("CPL") has proven to be a high-speed, area-efficient, and low-power technique [Yano:90] [Weste:93] [Shimohigashi:93]. FIG. 1f shows an example of a basic prior-art CPL logic circuit 60 [Yano:90]. In the embodiment shown in FIG. 1f, the same circuit is used to implement AND, NAND, OR, and NOR functions; the function is determined by selection of the signals provided at the circuit inputs. The design method presented by Yano et al. [Yano:90] had no p-channel transistor in the pass network. Dual input signals and n-channel pass-transistors were used to implement dual-output gate circuits.

The circuit shown in FIG. 1f does have drawbacks. Circuit 60 does not make efficient transitions with respect to logic-high input signals because of the poor "one" conduction problem of the NMOS pass-transistors (the maximum voltage for logic "one" is bounded by $V_{DD}-V_T$). So Yano et al. [Yano:90] utilized a specific fabrication technology, in which NMOS pass-transistors 62 were designed to have a zero threshold voltage $V_T=0$ volts, whereas the other NMOS and PMOS transistors had a $V_T=\pm 0.4$ volts, respectively. With this design method, the quality of the logic-high is indeed improved, but noise immunity and reliability are reduced. In addition, the special fabrication requirements limit its wide application.

None of the above methods appear to teach how to design a family of field-effect-transistor-based circuits which provide substantially equal delays regardless of the pattern of the input logic-state transitions, and which provide a high-quality logic one as well as a high-quality logic zero.

SUMMARY OF THE INVENTION

The present invention is a family of CFET logic circuits useful for wave-pipeline systems, and a method to design same. The invention uses complementary transmission gates and pull-up or pull-down transistors to achieve a family of CFET logic circuits which include AND, NAND, OR, NOR, XOR, XNOR, select, select-invert, invert, and not-invert functions. Each circuit is tuned to provide substantially equal delays, high-quality logic ones and zeros, and substantially equal rise and fall times for every combination of input-state transition and output-state transition.

According to one aspect of the present invention, a circuit is described which can be used for AND, NAND, OR, or NOR functions, depending on the input connections. This circuit includes a first pass transistor having a first terminal coupled to a first input signal, a second terminal coupled to an internal node, and a gate coupled to a second input signal; a second pass transistor having a first terminal coupled to the first input signal, a second terminal coupled to the internal node, and a gate coupled to a logical complement of the second input signal; a third transistor having a first terminal coupled to a voltage source, a second terminal coupled to the internal node, and a gate coupled to the second input signal; and a driver coupled to the internal node, the driver comprising means for amplifying a voltage, adjusting logic levels, and providing an output signal. If the voltage source coupled to the third transistor is a "one" level, the circuit can be used as an AND or NOR gate. If the voltage source coupled to the third transistor is a "zero" level, the circuit can be used as a NAND or OR gate. In one embodiment, the first transistor has a first channel type, the second transistor has a second channel type, and the third transistor also has the second channel type. In one such embodiment, the first channel type is N-channel, and the second channel type is P-channel. In another embodiment, the first channel type is P-channel, and the second channel type is N-channel.

According to another aspect of the present invention, a circuit is described which can be used for XOR, XNOR, select, or inverse-select functions. This circuit includes a first pass transistor having a first terminal coupled to a first input signal, a second terminal coupled to an internal node, and a gate coupled to a second input signal; a second pass transistor having a first terminal coupled to the first input signal, a second terminal coupled to the internal node, and a gate coupled to a logical complement of the second input signal; a third pass transistor having a first terminal coupled to a logical complement of the first input signal, a second terminal coupled to the internal node, and a gate coupled to a logical complement of the second input signal; a fourth pass transistor having a first terminal coupled to a logical complement of the first input signal, a second terminal coupled to the internal node, and a gate coupled to the second input signal; and a driver coupled to the internal node, comprising means for amplifying a voltage, adjusting logic levels, and providing an output signal. In one embodiment, the first and third transistors have a first channel type, and the second and fourth transistor have a second channel type. In one such embodiment, the first channel type is N-channel, and the second channel type is P-channel. In another embodiment, the first channel type is P-channel, and the second channel type is N-channel.

According to yet another aspect of the present invention, a circuit is described which can be used for generating dual-rail signals from single-rail signals, or for inverting or non-inverting delay buffers. This circuit includes a first pass transistor having a first terminal coupled to a first input signal, a second terminal coupled to an internal node, and a gate coupled to a first voltage source; a second pass transistor having a first terminal coupled to the first input signal, a second terminal coupled to the internal node, and a gate coupled to a second voltage source; and a driver coupled to the internal node, the driver comprising means for amplifying a voltage, adjusting logic levels, and providing an output signal.

According to yet another aspect of the present invention, a method is described for designing a CFET logic circuit having a uniform overall gate delay. The method comprises the steps: forming a Karnaugh map of the desired function; assigning each cell in the Karnaugh map to a pair of adjacent cells; implementing a transmission gate for each pair of adjacent Karnaugh-map cells having one high value and one low value; implementing a pull-up transistor for each pair of adjacent Karnaugh-map cells having two high values; implementing a pull-down transistor for each pair of adjacent Karnaugh-map cells having two low values; and adjusting the sizes and/or speeds of the pull-up transistor, the pull-down transistor, and the transmission gate to make the overall gate delay and the transition times of the output signal substantially independent of input transition pattern.

According to yet another aspect of the present invention, a method is described for designing a CFET logic gate-pair circuit having a delay substantially independent of input transition pattern, where the circuit has a first pull transistor, a second pull transistor having a channel type complementary to the channel type of the first pull transistor, and a first transmission gate comprising an NFET and a PFET. The method comprises the steps: providing a size for the first pull transistor; determining a size for the second pull transistor in order to ensure substantially equal rise and fall times of the first and second pull transistors; determining a ratio of NFET size to PFET size of the first transmission gate to ensure substantially equal rise and fall times of the transmission gate; and determining a ratio of the first transmission gate size to the first pull transistor size to ensure substantially equal transition times and substantially equal gate propagation delays.

According to yet another aspect of the present invention, a complementary field-effect transistor logic circuit is described comprising a first pass transistor having a first channel type and having a first terminal coupled to a first input signal, a second terminal coupled to an internal node, and a gate coupled to a second input signal; a second pass transistor having a second channel type which is complementary to the first channel type and having a first terminal coupled to the first input signal, a second terminal coupled to the internal node, and a gate coupled to a logical complement of the second input signal; a third transistor having the second channel type and having a first terminal coupled to a voltage terminal, a second terminal coupled to the internal node, and a gate coupled to the second input signal; and a driver coupled to the internal node, comprising means for amplifying a voltage and adjusting logic levels at an output signal.

According to yet another aspect of the present invention, a complementary field-effect transistor logic circuit is described comprising a first transistor for coupling a first input signal to an output signal in response to a second input signal; a second transistor for coupling the first input signal to the output signal in response to a logical complement of the second input signal; and a third transistor for coupling a logical-high signal to the output signal in response to the second input signal; wherein parameters of the first, second, and third transistors are chosen such that propagation delays for any combination of logical value transitions are substantially equal.

According to yet another aspect of the present invention, a complementary field-effect transistor parallel-adder logic circuit is described comprising a plurality of pg generator circuits wherein each pg generator circuit comprises an AND/NAND gate circuit and a XOR/XNOR gate circuit; a plurality of black processor circuits wherein at least two of the black processor circuits are coupled to outputs of the pg generator circuits and wherein each black processor circuit comprises a MUX/inverse-MUX gate circuit and an AND/NAND gate circuit; and a plurality exclusive-OR circuits coupled to at least two outputs of the black processor circuits.

According to yet another aspect of the present invention, a complementary field-effect transistor 4:2 compressor logic circuit is described comprising a first OR/NOR gate coupled to a first input signal and a second input signal and producing a first internal OR/NOR signal; a second OR/NOR gate coupled to a third input signal and a fourth input signal and producing a second internal OR/NOR signal; a first AND/NAND gate coupled to the first internal OR/NOR signal and the second internal OR/NOR signal and producing a carry-out signal; a second AND/NAND gate coupled to the first input signal and the second input signal and producing a first internal AND/NAND signal; a third AND/NAND gate coupled to the third input signal and the fourth input signal and producing a second internal AND/NAND signal; a third OR/NOR gate coupled to the first internal AND/NAND signal and the second internal AND/NAND signal and producing a third internal OR/NOR signal; a first XOR/XNOR gate coupled to the first input signal and the second input signal and producing a first internal XOR/XNOR signal; a second XOR/XNOR gate coupled to the third input signal and the fourth input signal and producing a second internal XOR/XNOR signal; a third XOR/XNOR gate coupled to the first internal XOR/XNOR signal and the second internal XOR/XNOR signal and producing a third internal XOR/XNOR signal; a fourth XOR/XNOR gate coupled to the third internal XOR/XNOR signal and a carry-in signal and producing an S signal; and a MUX/inverse-MUX gate coupled to the third internal XOR/XNOR signal and the carry-in signal and the third internal OR/NOR signal and producing a C signal.

BRIEF DESCRIPTION OF THE DRAWINGS

FIG. 5a is a schematic diagram showing an equivalent circuit for the 11→00 and 11→10 input state transitions of the circuit in FIG. 2b.

FIG. 5b is a schematic diagram showing an equivalent circuit for the 11→00 and 11→10 input state transitions of the circuit in FIG. 2d.

DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 2A:
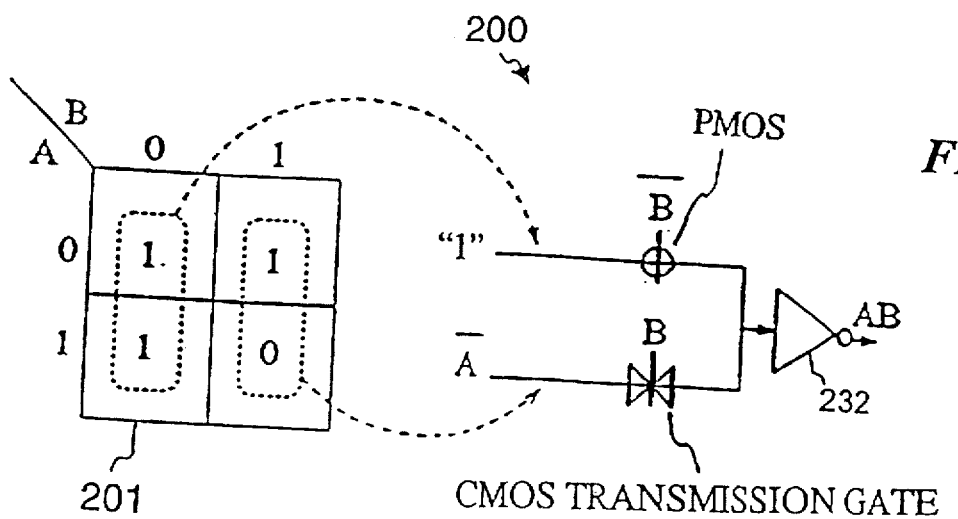
FIG. 2a is a schematic flow diagram illustrating a method for designing a gate circuit from an inverse Karnaugh map according to the invention.
Figure 2B:
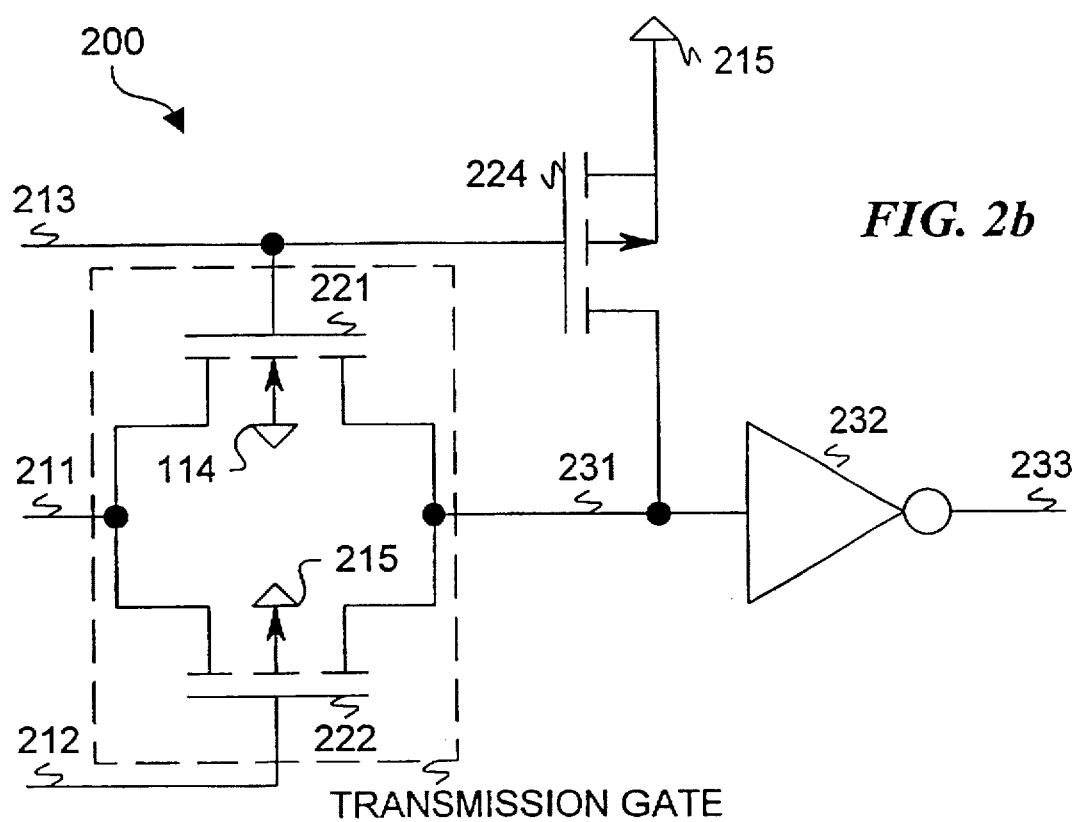
FIG. 2b is a schematic diagram illustrating an embodiment of a CFET logic circuit according to the invention having an output which has one high-level output state.

Improved Complementary Pass-transistor Logic (CPL) circuits can be used as the basic cells to implement a high-performance CFET wave-pipelined system. This family of basic cells, called "Wave-pipelined Transmission-Gate Logic" ("WTGL"), can be designed to have substantially equal signal rise and fall times and reduced gate-delay variations. Each circuit uses a configuration of transmission gates, pull-up/pull-down transistors, and dual-rail input signals to perform a basic logic function; each circuit also has an invertor-driver to drive the next logic stage. In one embodiment, the invertor-driver is fabricated in CMOS, as shown in FIG. 2e.

A Karnaugh map can be used to design the basic WTGL cell. The procedure for designing a two-input AND gate is shown in FIGS. 2a and 2b. Please note that in these embodiments, since each basic cell is buffered by an invertor, the Karnaugh maps are shown for the logical complements of the desired functions. For instance, in FIG. 2a, Karnaugh map 201 shows the map for the inverse of a two-input AND gate, which has three high states and one low state. According to Karnaugh map 201, a pass network 200 with inputs of A, B, and "one" could be used to provide the function shown in FIG. 2a, with driver-invertor circuit 232 providing the proper-polarity AND function.

Figure 1A:
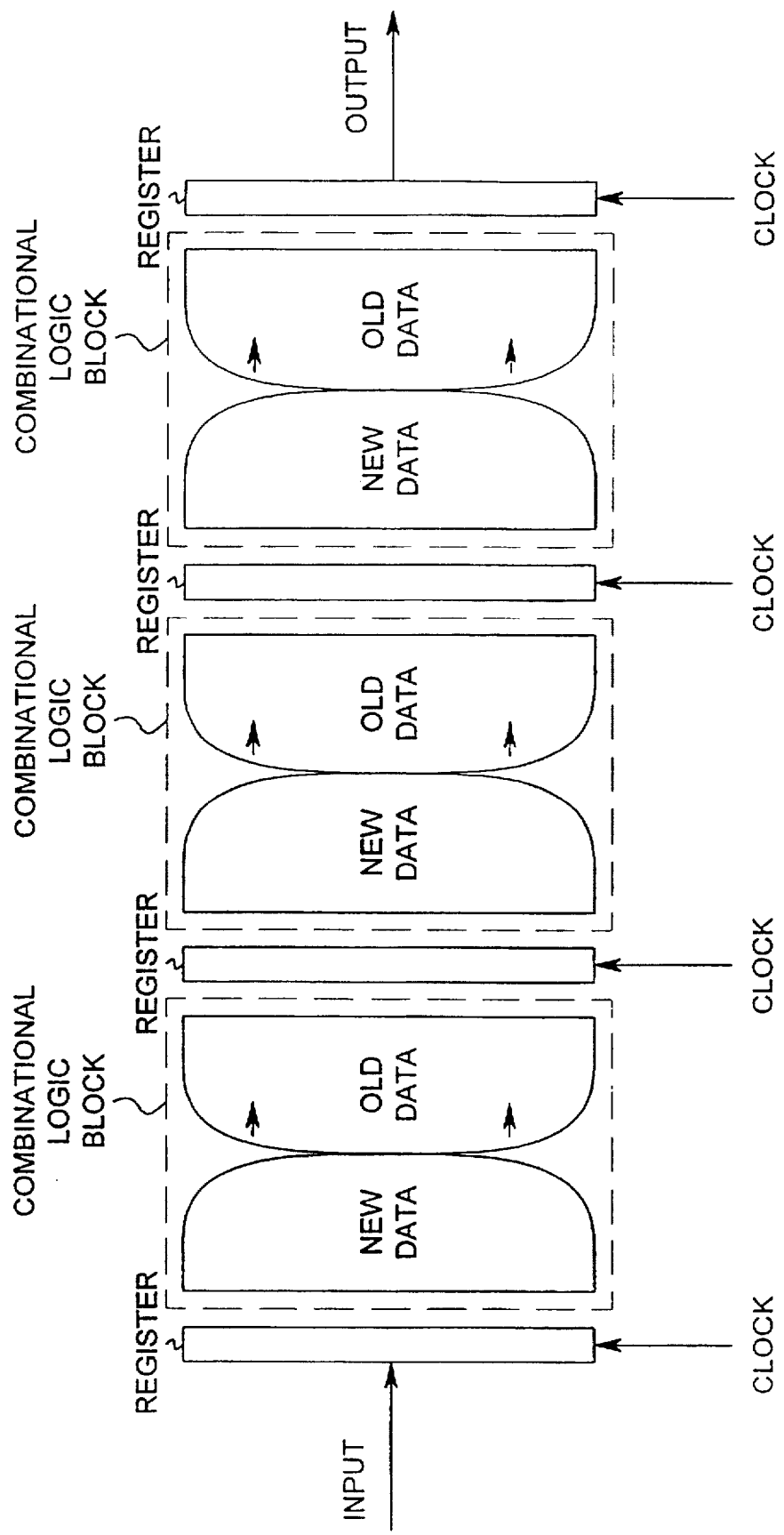
FIG. 1a is a schematic diagram illustrating a regular pipelining technique.
Figure 1B:
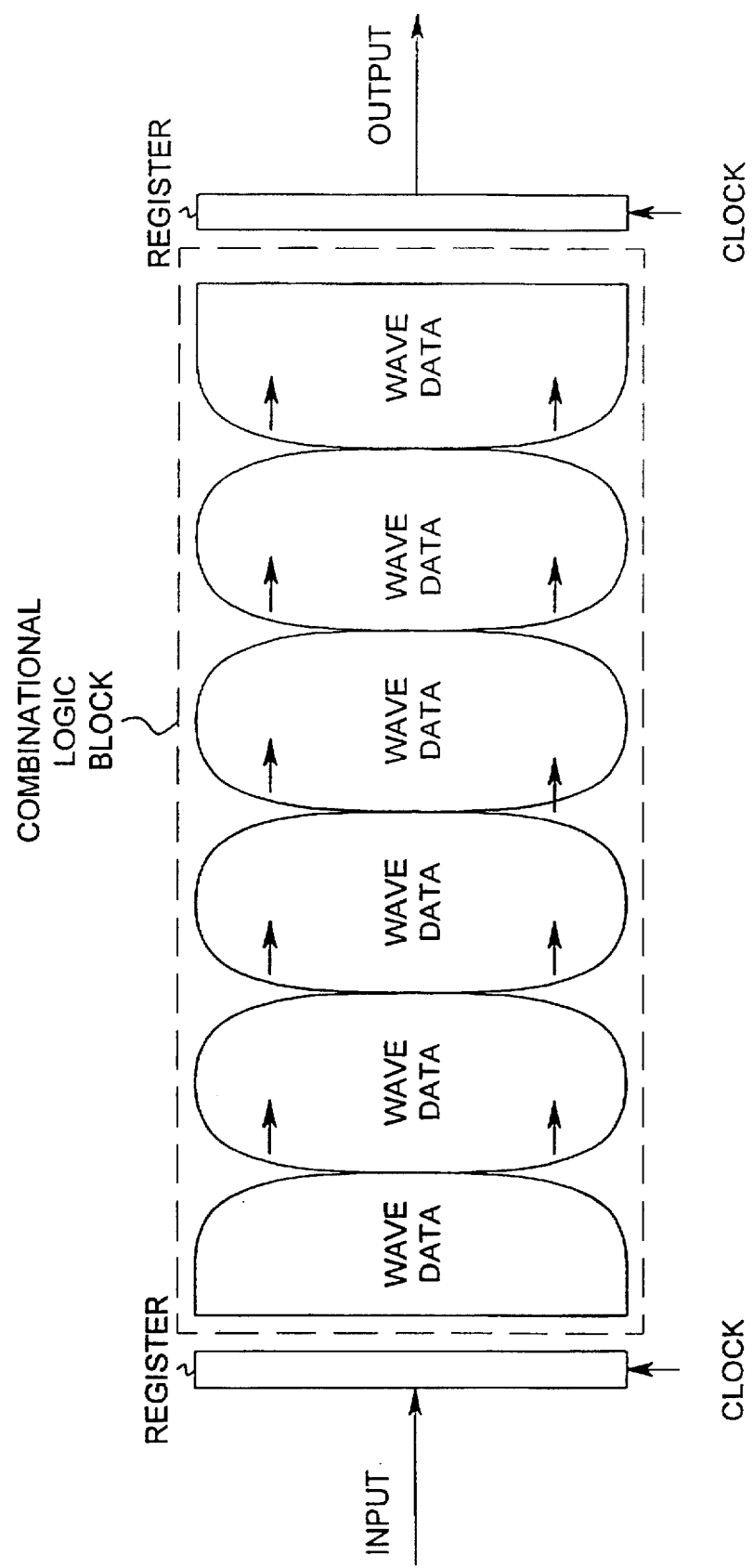
FIG. 1b is a schematic diagram illustrating a wave-pipelining technique.
Figure 1C:
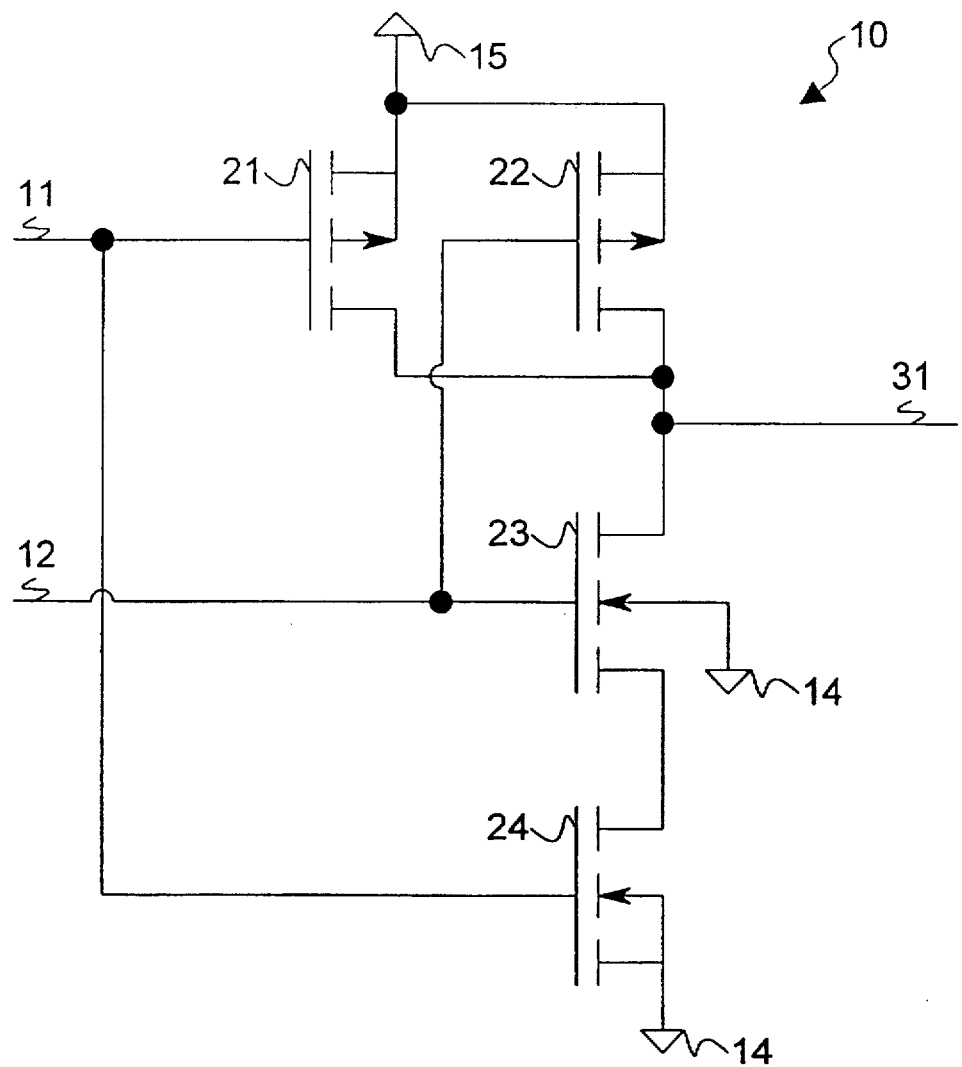
FIG. 1c is a schematic diagram illustrating a prior-art CMOS NAND gate.
Figure 1D:
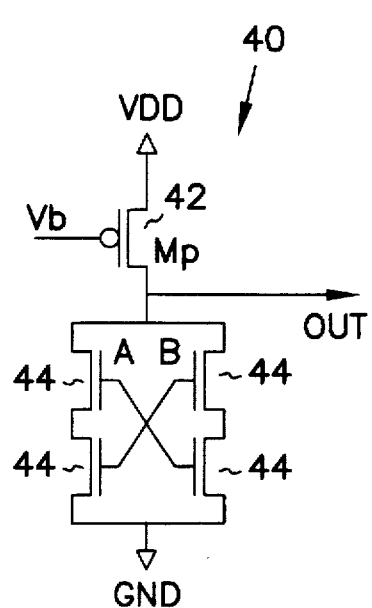
FIG. 1d is a schematic diagram illustrating a prior-art cross-coupled pseudo-NMOS NAND gate.
Figure 1E:
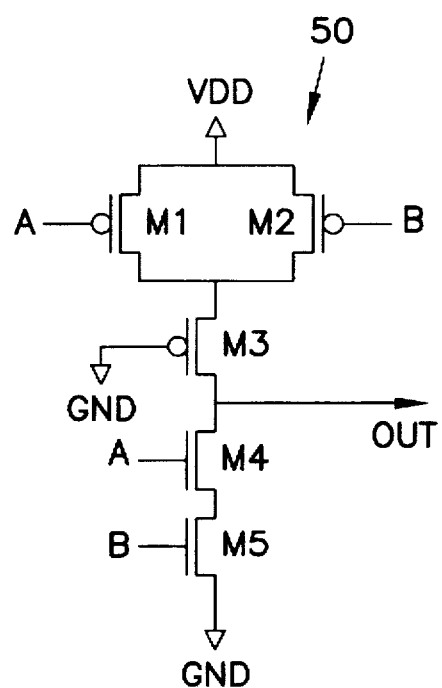
FIG. 1e is a schematic diagram illustrating a prior-art balanced-CMOS NAND gate.
Figure 1F:
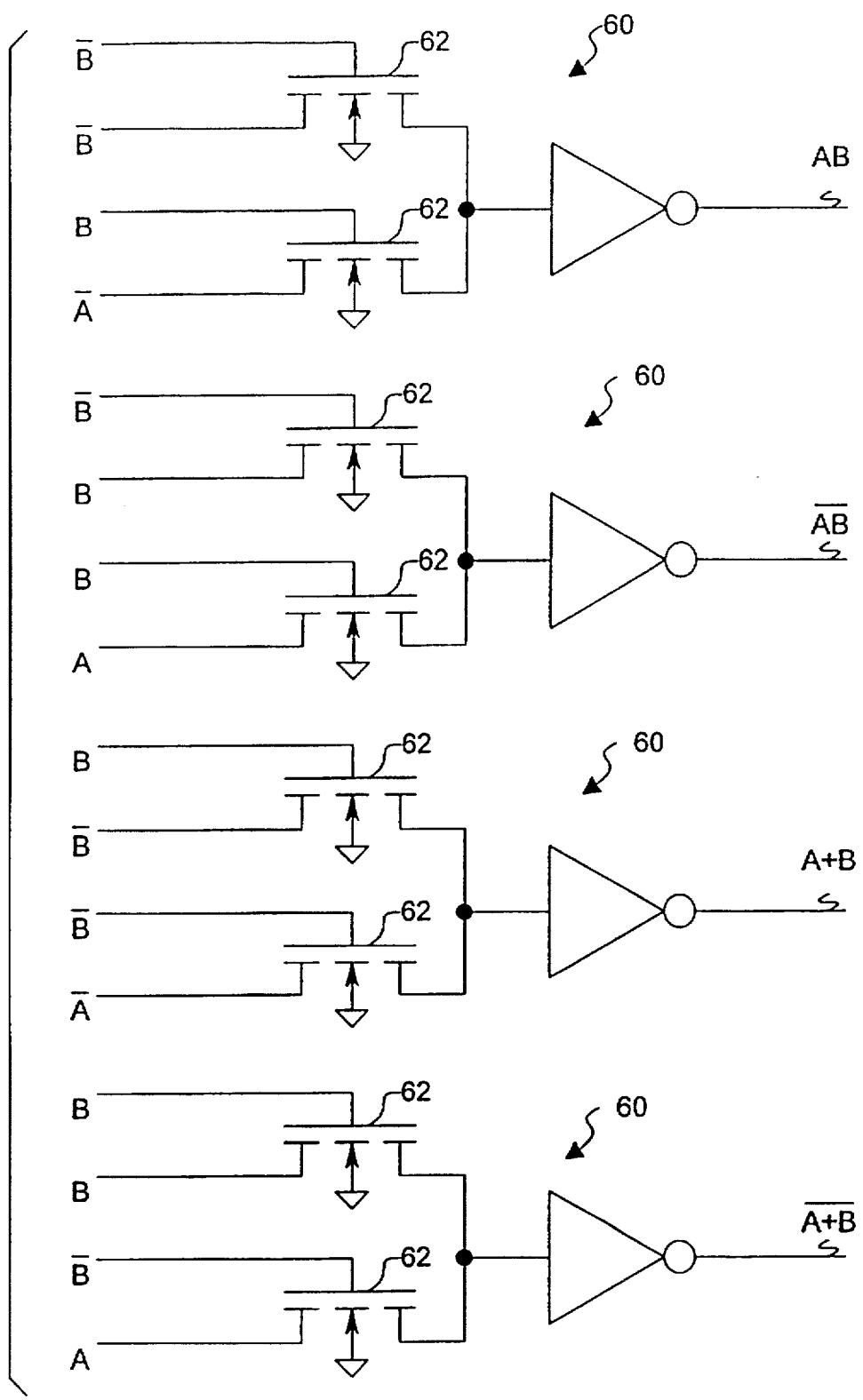
FIG. 1f is a schematic diagram illustrating a prior-art Complementary Pass-transistor Logic (CPL) AND/NAND/OR/NOR gate.

FIG. 2b shows one embodiment of a pass network 200 which can be used to implement the AND function of FIG. 2a. Although the embodiment shown in FIG. 2b uses CMOS transistors, persons skilled in the art will readily understand that any complementary field-effect transistor technology could be used to advantage. In the embodiment shown in FIG. 2b, a CMOS transmission gate (transistors 221 and 222) and a pull-up transistor 224 have replaced the NMOS pass-transistor of the CPL designs shown in FIG. 1f. Thus, the quality of logic "one" is guaranteed at the gates of output invertors even using standard CMOS technology.

In this embodiment, n-channel pass transistor 221 and p-channel pass transistor 222 form a CFET transmission gate. (In this configuration, it is not particularly meaningful to distinguish transistor terminals as drain or source, since the relative voltage between input 211 and node 231 may be either positive or negative, depending on the states of inputs 211, 212, and 213. The physical layout is generally symmetric for the source, gate, and drain terminals. Therefore, rather than using the terms "source" and "drain", these drain/source transistor connections will each be called "terminals".) Input 211 is coupled to one terminal of n-channel pass transistor 221, input 213 is coupled to the gate of n-channel pass transistor 221, and the other terminal of n-channel pass transistor 221 is connected to node 231. Input 211 is also coupled to one terminal of p-channel pass transistor 222, input 212 is coupled to the gate of p-channel pass transistor 222, and the other terminal of p-channel pass transistor 222 is connected to node 231. In this embodiment, the substrates of the p-channel devices are internally connected to $V_{DD}$ (voltage 215 in this embodiment), and the substrates of the n-channel devices are internally connected to $V_{SS}$ (the ground voltage 216 in this embodiment).

The circuit of FIG. 2b can be used to implement the AND function of FIG. 2a. To do so, input 213 is connected to logic signal B of FIG. 2a, input 211 is connected to $\overline{A}$ of FIG. 2a, and input 212 is connected to $\overline{B}$ of FIG. 2a. The transmission gate formed by transistors 221 and 222 passes $\overline{A}$ from input 211 to node 231 if B is high, and is cutoff if B is low. $V_{DD}$ voltage 215 is coupled to one terminal of p-channel pull-up transistor 224, input 213 is coupled to the gate of p-channel pull-up transistor 224, and the other terminal of p-channel pull-up transistor 224 is connected to node 231. Pull-up transistor 224 passes a "one" from $V_{DD}$ voltage 215 to node 231 if B is low, and is cutoff if B is high. Thus, Karnaugh map 201 represents the state of node 231; invertor driver 232 then amplifies this voltage and inverts it (adjusting the logic level from negative to positive), thus providing the proper polarity AND function at output 233.

Figure 2C:
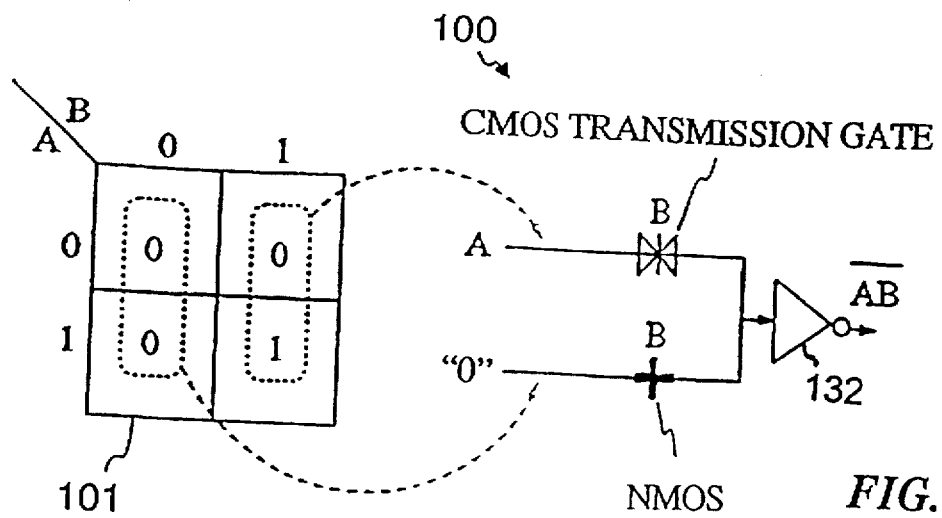
FIG. 2c is a schematic flow diagram illustrating a method for designing another gate circuit from an inverse Karnaugh map according to the invention.
Figure 2D:
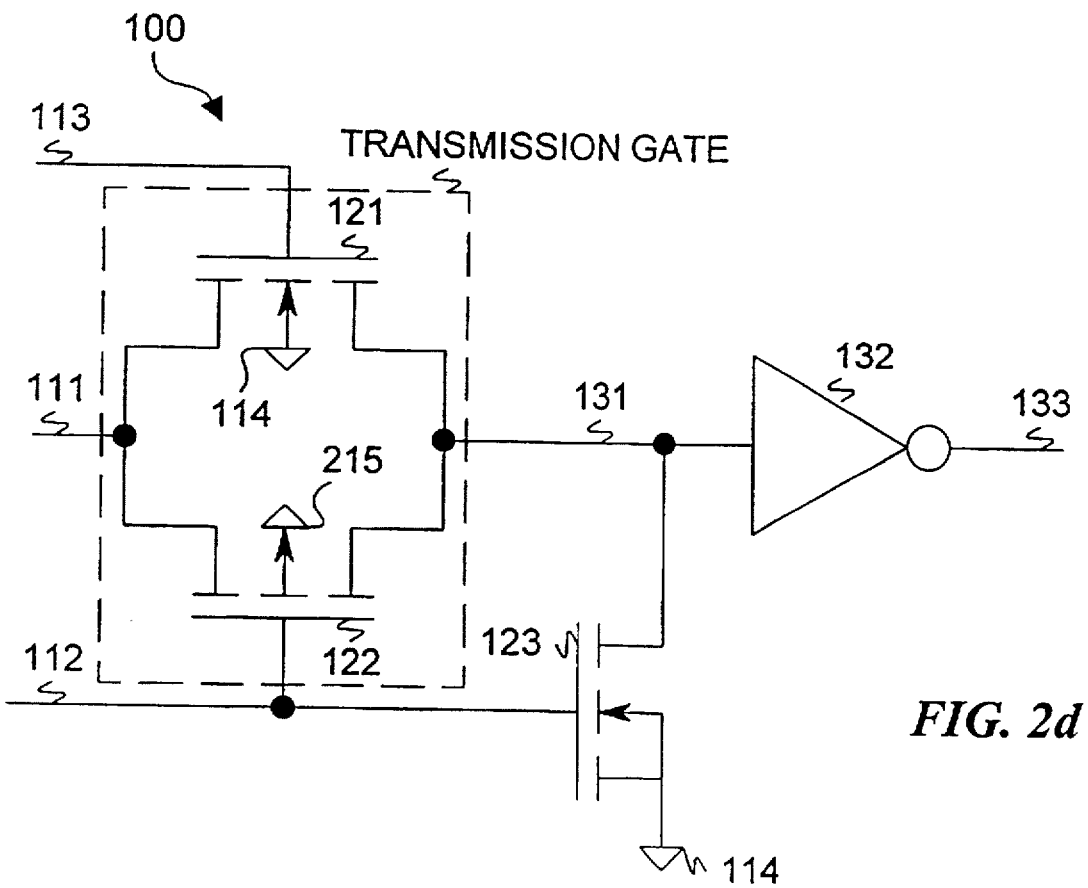
FIG. 2d is a schematic diagram illustrating an embodiment of a CFET logic circuit according to the invention having an output which has three high-level output states.
Figure 2E:
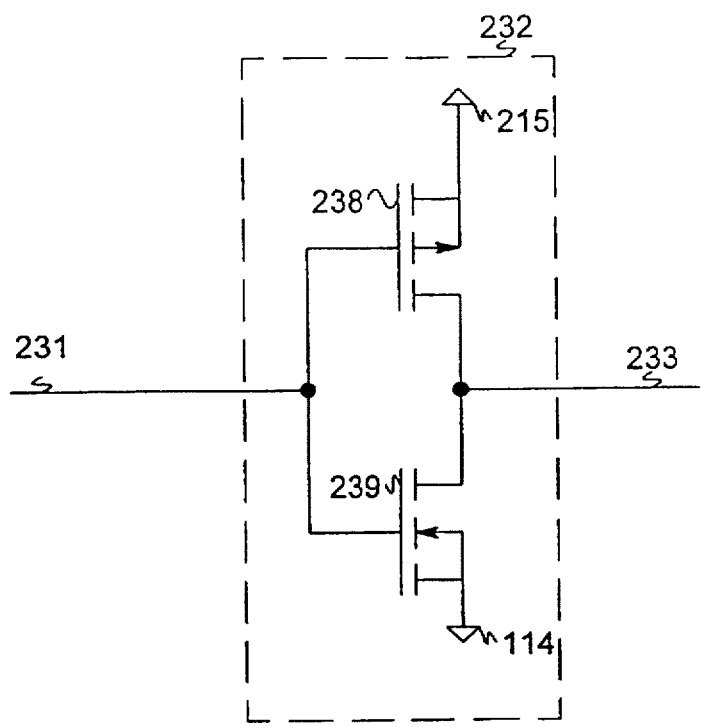
FIG. 2e is a schematic diagram illustrating an embodiment of a CFET logic circuit according to the invention providing an inverting buffer.

FIGS. 2c and 2d show the corresponding procedure for designing a two-input NAND gate. In FIG. 2c, Karnaugh map 101 shows the map for the inverse of a two-input NAND gate, which has three low states and one high state. According to the Karnaugh map 101, a pass network 100 having inputs of A, B, and "zero" could be used to provide the function shown in FIG. 2c.

FIG. 2d shows one embodiment of a pass network 100 which can be used to implement the NAND function of FIG.

2c. In this embodiment, n-channel pass transistor 121 and p-channel pass transistor 122 form a CFET transmission gate. Input 111 is coupled to one terminal of n-channel pass transistor 121, input 113 is coupled to the gate of n-channel pass transistor 121, and the other terminal of n-channel pass transistor 121 is connected to node 131. Input 111 is also coupled to one terminal of p-channel pass transistor 122, input 112 is coupled to the gate of p-channel pass transistor 122, and the other terminal of p-channel pass transistor 122 is connected to node 131.

The circuit of FIG. 2d can be used to implement the NAND function of FIG. 2c. To do so, input 113 is connected to B of FIG. 2c, input 111 is connected to A of FIG. 2c, and input 112 is connected to $\overline{B}$ of FIG. 2c. The transmission gate formed by transistors 121 and 122 passes A from input 111 to node 131 if B is high, and is cutoff if B is low. Ground voltage 114 is coupled to one terminal of n-channel pull-down transistor 123, input 112 is coupled to the gate of n-channel pull-down transistor 123, and the other terminal of n-channel pull-down transistor 123 is connected to node 131. Pull-down transistor 123 passes a "zero" from ground voltage 114 to node 131 if B is high, and is cutoff if B is low. Thus, Karnaugh map 101 represents the state of node 131; invertor driver 132 then amplifies this voltage and inverts it (adjusting the logic level from negative to positive), thus providing the proper polarity NAND function at output 133.

Figure 2F:
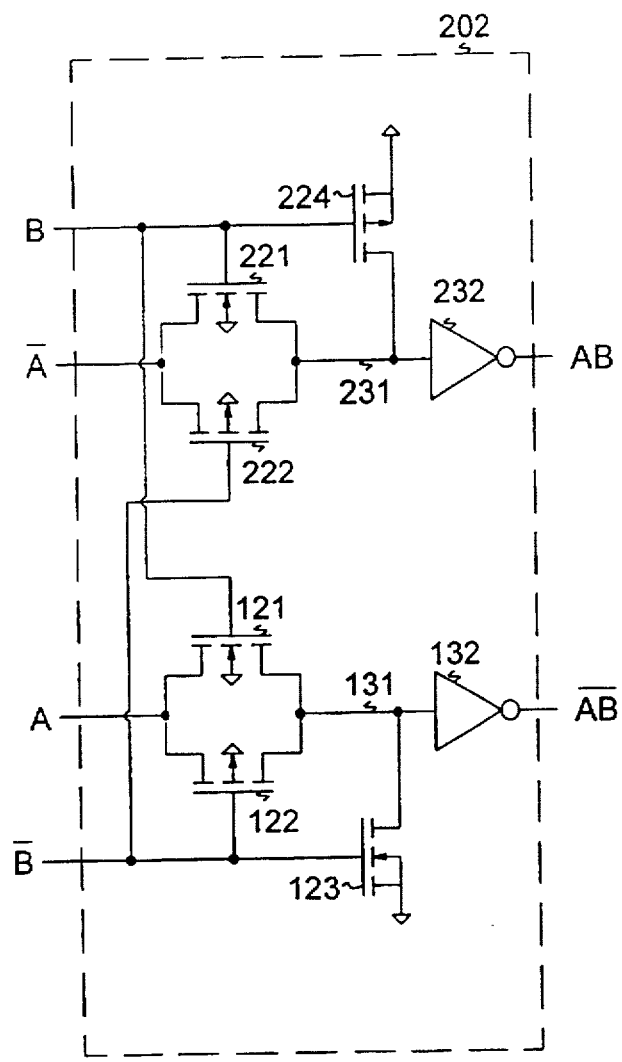
FIG. 2f is a schematic diagram illustrating an embodiment of a pair of CFET logic circuits as shown in FIGS. 2b and 2d connected to provide an AND/NAND function.
Figure 2G:
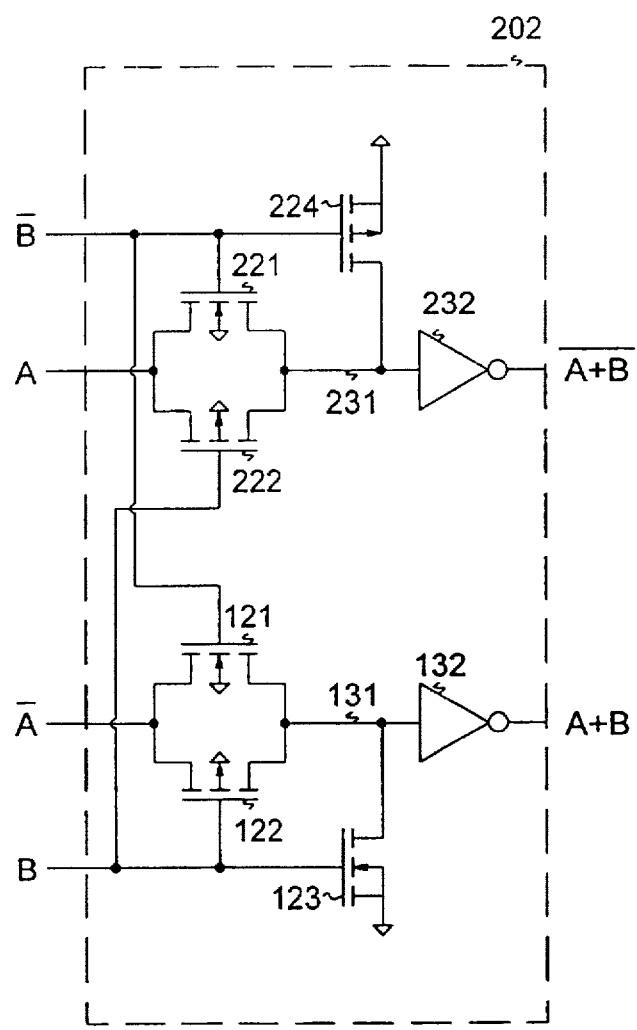
FIG. 2g is a schematic diagram illustrating an embodiment of a pair of CFET logic circuits as shown in FIGS. 2b and 2d connected to provide an OR/NOR function.

FIG. 2f is a schematic diagram illustrating an embodiment of a pair of CFET logic circuits as shown in FIGS. 2b and 2d connected to provide an AND/NAND function. Paired circuit 202 produces AB and, at the same time and with the same delay, $\overline{AB}$. This circuit can also be used to implement an OR/NOR function (e.g., A to input 211, $\overline{B}$ to input 213, and B to input 212 provides the NOR function, NOT(A+B), at output 233; $\overline{A}$ to input 111, $\overline{B}$ to input 113, and B to input 112 provides the OR function A+B at output 133). FIG. 2g is a schematic diagram illustrating an embodiment of a pair of CFET logic circuits as shown in FIGS. 2b and 2d connected as a paired circuit 202 to provide an OR/NOR function.

Figure 3A:
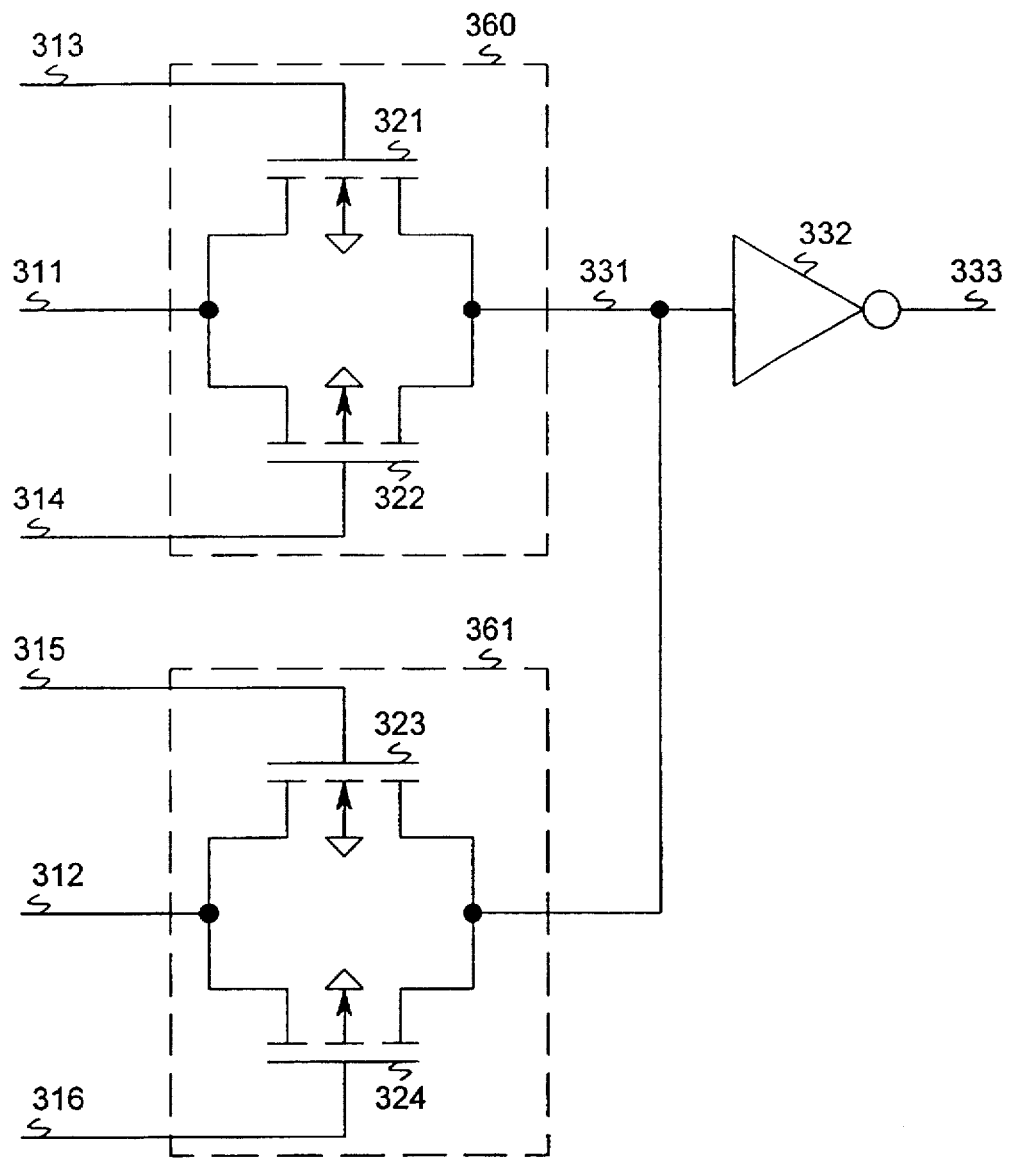
FIG. 3a is a schematic diagram illustrating an embodiment of a CFET logic circuit according to the invention having an output which has two high-level output states.

FIG. 3a is a schematic diagram illustrating an embodiment of a CFET logic circuit according to the invention having an output which has two high-level output states. This circuit is used to implement the exclusive-OR ("XOR") function or the inverse-XOR function. In addition, this circuit is used to provide the multiplexor ("MUX") function and the inverse-MUX function. In the embodiment shown in FIG. 3, n-channel pass transistor 321 and p-channel pass transistor 322 form one CFET transmission gate; n-channel pass transistor 323 and p-channel pass transistor 324 form another CFET transmission gate. Input 311 is coupled to one terminal of n-channel pass transistor 321, input 313 is coupled to the gate of n-channel pass transistor 321, and the other terminal of n-channel pass transistor 321 is connected to node 331. Input 311 is also coupled to one terminal of p-channel pass transistor 322, input 314 is coupled to the gate of p-channel pass transistor 322, and the other terminal of p-channel pass transistor 322 is connected to node 331. Input 312 is coupled to one terminal of n-channel pass transistor 323, input 315 is coupled to the gate of n-channel pass transistor 323, and the other terminal of n-channel pass transistor 323 is connected to node 331. Input 312 is also coupled to one terminal of p-channel pass transistor 324, input 316 is coupled to the gate of p-channel pass transistor 324, and the other terminal of p-channel pass transistor 324 is connected to node 331.

Figure 3B:
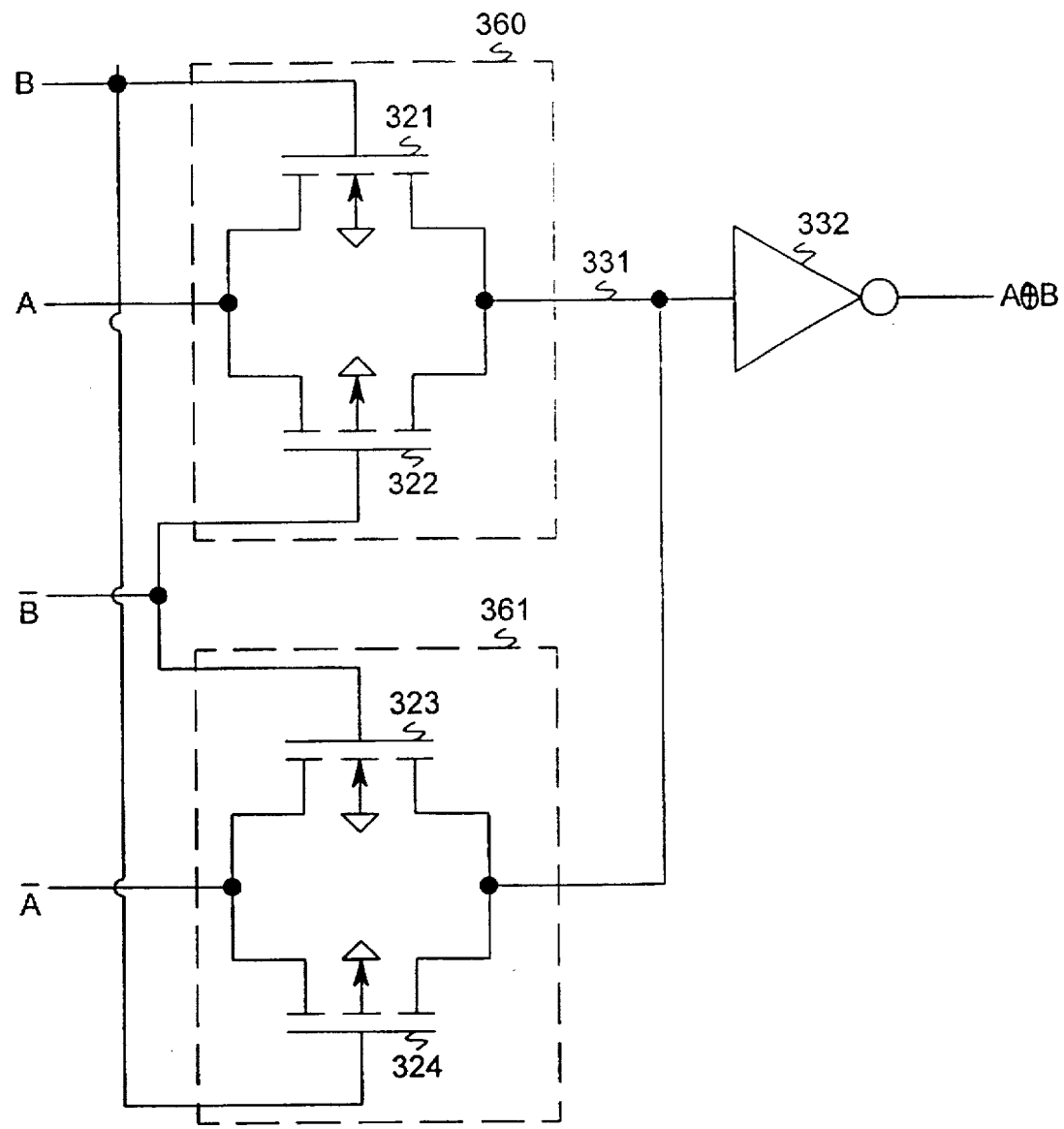
FIG. 3b is a schematic diagram illustrating an embodiment of a CFET logic circuit as shown in FIG. 3a connected to provide an XOR function.

FIG. 3b is a schematic diagram illustrating an embodiment of a CFET logic circuit as shown in FIG. 3a connected to provide an XOR function. In this embodiment, inputs 313 and 316 are connected to B, input 311 is connected to A, inputs 314 and 315 are connected to $\overline{B}$, and input 312 is connected to $\overline{A}$. The transmission gate formed by transistors 321 and 322 passes A from input 311 to node 331 if B is high, and is cutoff if B is low. The transmission gate formed by transistors 323 and 324 passes $\overline{A}$ from input 312 to node 331 if B is low, and is cutoff if B is high. Thus, ($\overline{A}$B+A$\overline{B}$) represents the state of node 331; invertor driver 332 then amplifies this voltage and inverts it (adjusting the logic level from negative to positive), thus providing the proper polarity XOR function (A$\overline{B}$+$\overline{A}$B) at output 333.

Figure 3C:
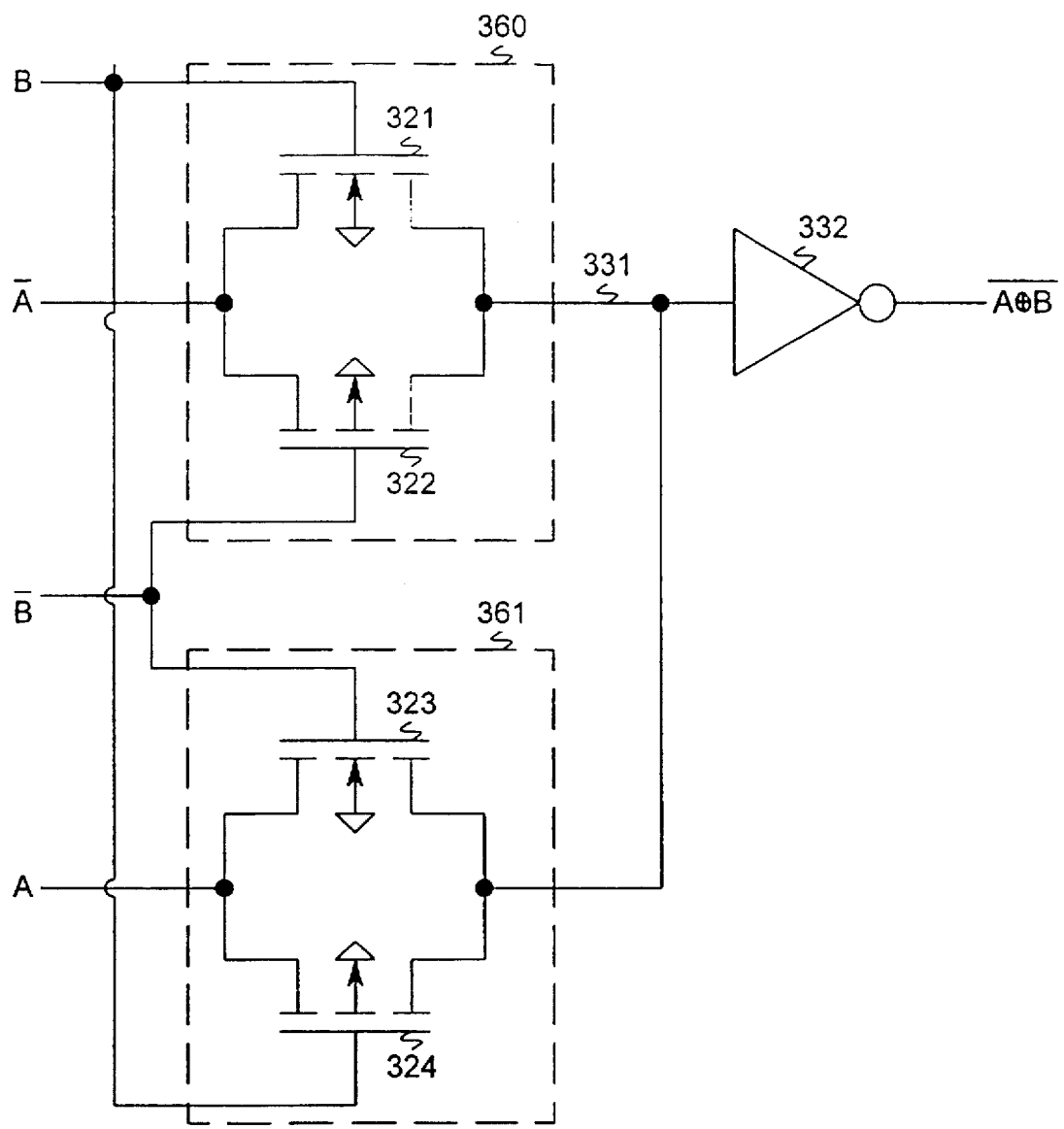
FIG. 3c is a schematic diagram illustrating an embodiment of a CFET logic circuit as shown in FIG. 3a connected to provide an XNOR function.

Another embodiment, shown in FIG. 3c, uses a CFET logic circuit as shown in FIG. 3a connected to provide the inverse-exclusive-OR ("XNOR") function. Inputs 313 and 316 are connected to B, input 311 is connected to $\overline{A}$, inputs 314 and 315 are connected to $\overline{B}$, and input 312 is connected to A. The transmission gate formed by transistors 321 and 322 passes $\overline{A}$ from input 311 to node 331 if B is high, and is cutoff if B is low. The transmission gate formed by transistors 323 and 324 passes A from input 312 to node 331 if B is high, and is cutoff if B is low. Thus, ($\overline{A}\overline{B}$+AB) represents the state of node 331; invertor driver 332 then amplifies this voltage and inverts it (adjusting the logic level from negative to positive), thus providing the proper polarity XNOR function ($\overline{A}$B+AB) at output 333.

Figure 3D:
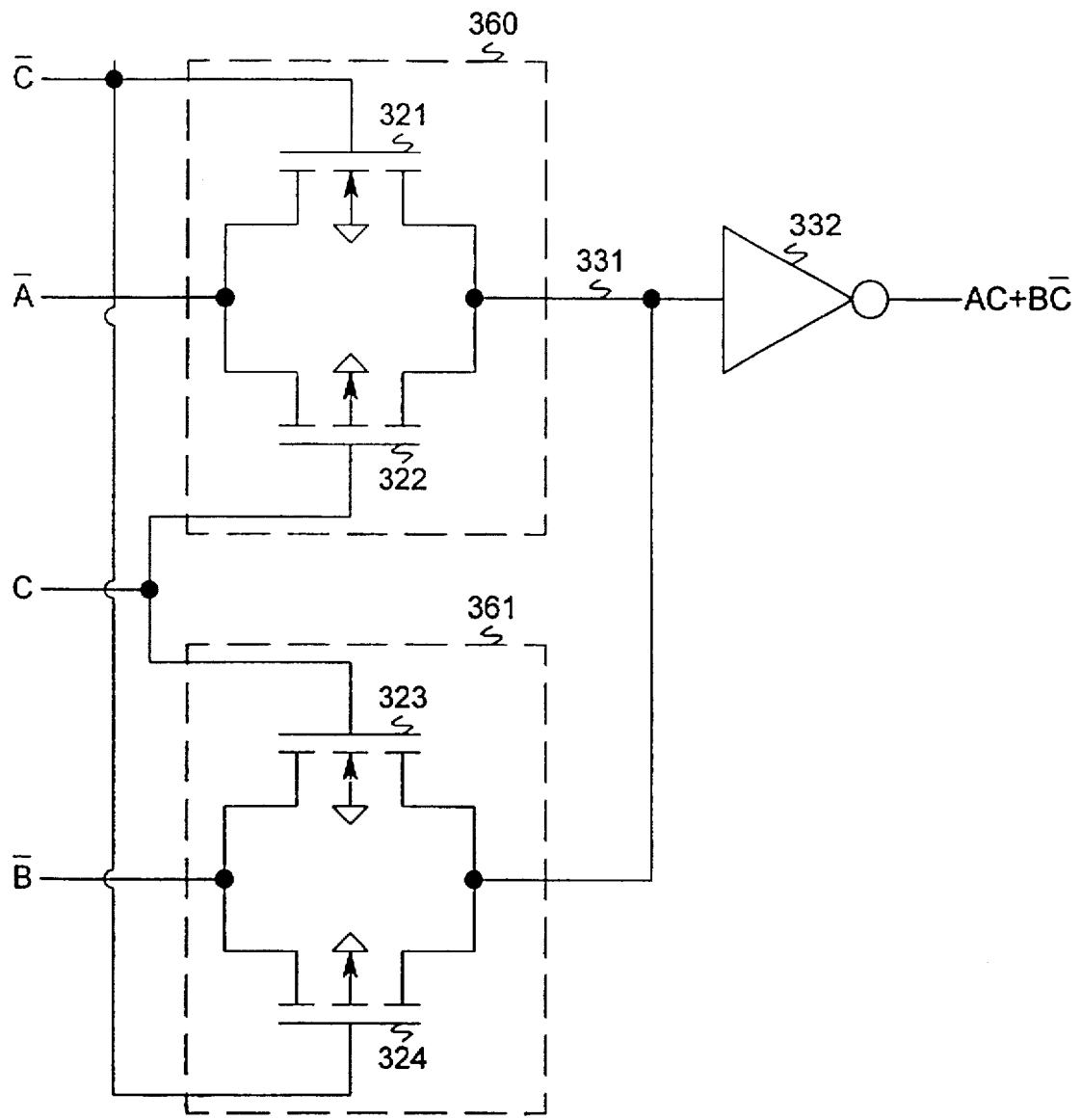
FIG. 3d is a schematic diagram illustrating an embodiment of a CFET logic circuit as shown in FIG. 3a connected to provide a 2-input multiplexor function.

Yet another embodiment, shown in FIG. 3d, uses a CFET logic circuit as shown in FIG. 3a connected to provide a 2-input multiplexor ("MUX") function. Inputs 313 and 316 are connected to $\overline{C}$, input 311 is connected to $\overline{A}$, inputs 314 and 315 are connected to C, and input 312 is connected to $\overline{B}$. Thus, NOT(AC+B$\overline{C}$) represents the state of node 331; invertor driver 332 then amplifies this voltage and inverts it, providing the proper-polarity MUX function (AC+B$\overline{C}$) at output 333.

Figure 3E:
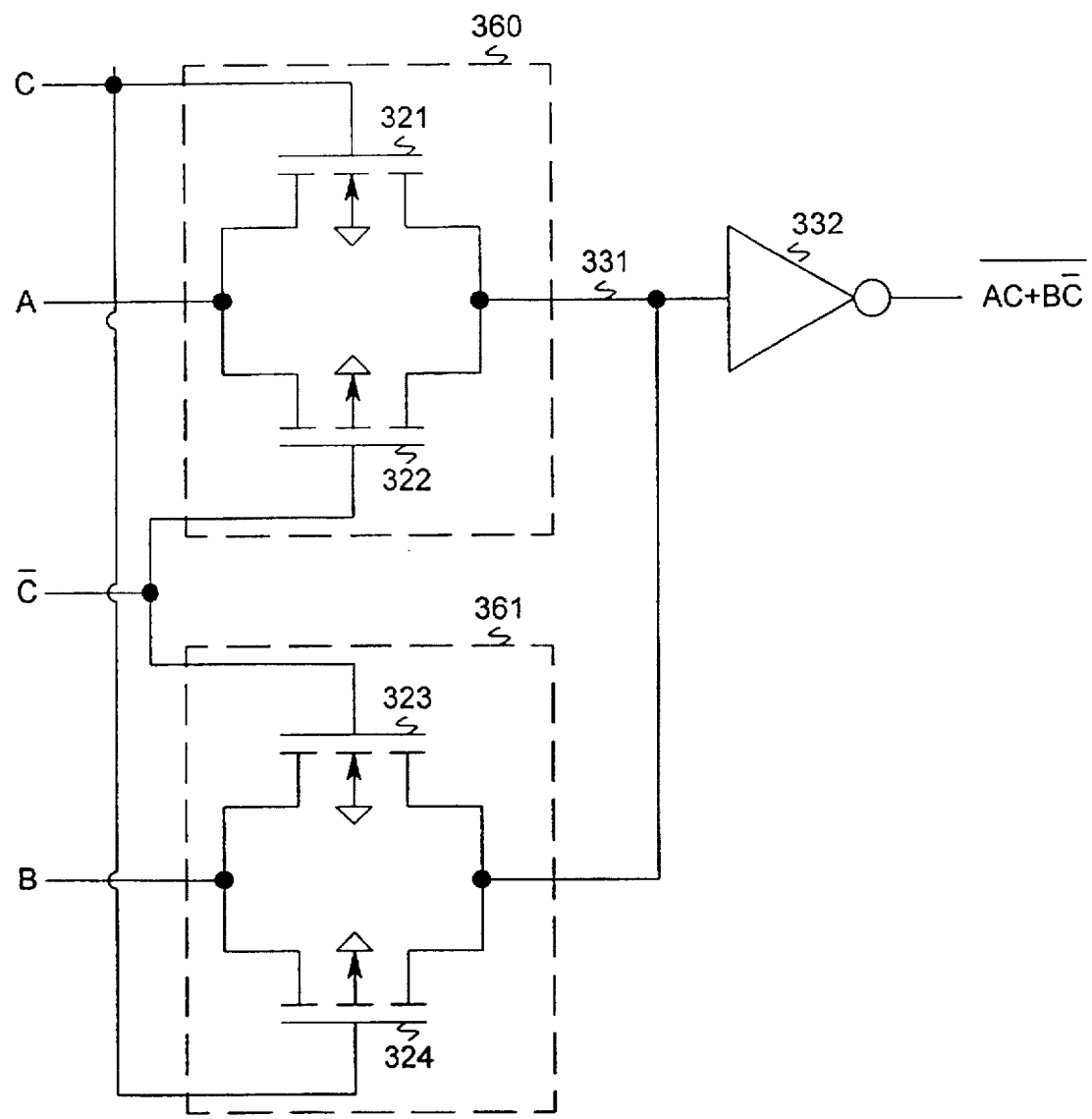
FIG. 3e is a schematic diagram illustrating an embodiment of a CFET logic circuit as shown in FIG. 3a connected to provide an inverse 2-input multiplexor function.

Yet another embodiment, shown in FIG. 3e, uses a CFET logic circuit as shown in FIG. 3a connected to provide a inverse 2-input multiplexor ("inverse-MUX") function. Inputs 313 and 316 are connected to C, input 311 is connected to A, inputs 314 and 315 are connected to $\overline{C}$, and input 312 is connected to B. Thus, (AC+B$\overline{C}$) represents the state of node 331; invertor driver 332 then amplifies this voltage and inverts it, providing the proper-polarity inverse-MUX function NOT(AC+B$\overline{C}$) at output 333.

Figure 4A:
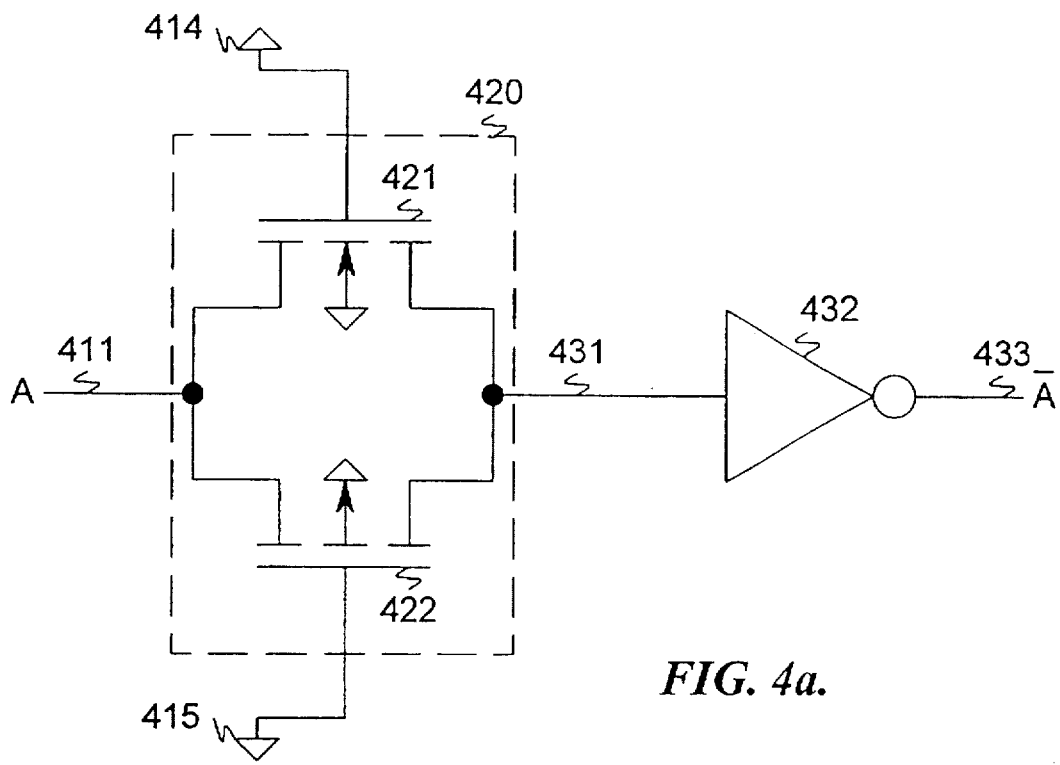
FIG. 4a is a schematic diagram illustrating an embodiment of a CFET logic circuit according to the invention having an inverting output state.

Even when a logic function is not required, it is critical to maintain corresponding logic delays through each wave-pipeline section. To do this, the WTGL family of circuits includes a non-inverting and inverting logic circuits. FIG. 4a is a schematic diagram illustrating an embodiment of a CFET logic circuit according to the invention having an inverting output state. Transmission gate 420 formed by transistors 421 and 422 always passes signal A from input 411 to node 431. Invertor 432 inverts this signal and provides $\overline{A}$ at output 433 with the same delay characteristics as the other above-described circuits of the invention. Because the transmission gate circuit is similar to those of FIGS. 2b, 2d, and 3, the delay characteristics can be adjusted to match those of the logic gates.

Figure 4B:
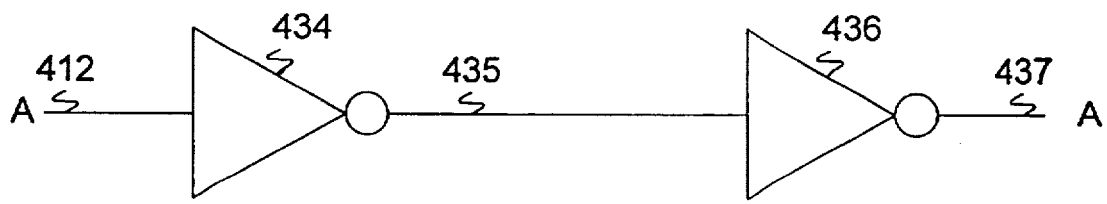
FIG. 4b is a schematic diagram illustrating an embodiment of a CFET logic circuit according to the invention having a non-inverting output state.

FIG. 4b is a schematic diagram illustrating an embodiment of a CFET logic circuit according to the invention having a non-inverting output state. Invertor 434 is designed to match the delay characteristics of a transmission gate such as transmission gate 420 of FIG. 4a. If input 412 is coupled to signal A, then node 435 will represent $\overline{A}$. Invertor 436 then re-inverts the signal at node 435 and provides signal A at output 437 with the same delay characteristics as the other above-described circuits of the invention.

In order to implement a high-speed wave-pipelined system, the basic cells must have good delay properties, and must be as insensitive to the input signal transition patterns as possible. Therefore, the delay characteristics of WTGL gate circuits must be critically analyzed to evaluate the feasibility of each circuit for wave-pipelining design.

The actual delay properties of the WTGL circuits in FIGS. 2b and 2d depend strongly on device sizing. This gate delay can be evaluated and compared by, for instance, observing the charging and discharging of internal nodes 231 and 131.

Any of numerous methods well known to persons skilled in the art can be used to choose or adjust the parameters which affect the speeds of the various transistors to achieve overall gate delay balance, including but not limited to: adjusting the width-to-length ratio of the transistor gate of a field-effect transistor, adjusting the thickness of a gate insulator, adjusting the carrier or impurity density, choosing the semiconductor material (e.g., silicon or gallium-arsenide) and doping material (e.g., phosphorus or arsenic), and changing the capacitances associated with the various terminals of the transistor.

The circuit in FIG. 2b has two alternatively-conducting paths to node 231: one is pull-up transistor 224, the other is the transmission gate (TG) formed by pass transistor 221 and pass transistor 222. Similarly, the circuit in FIG. 2d has two alternatively-conducting paths to node 131: one is pull-down transistor 123, the other is the transmission gate formed by pass transistor 121 and pass transistor 122. So with careful layout design of the basic circuit, it is possible to minimize the delay variations for all the input-pattern combinations by balancing the sizes of pull-up and pull-down transistors and the transmission gates. After detailed analysis of all the input-pattern combinations, four cases of 231 (or 131) node charging and discharging equivalent circuits were obtained, as shown in FIGS. 5a through 5j. The dashed invertors at the inputs are the output driver-invertors of the previous stage. Dashed capacitors 239 and 139 are the equivalent lumped capacitances of the internal wiring and input gates of invertor-drivers 232 and 132 respectively.

Figure 5C:
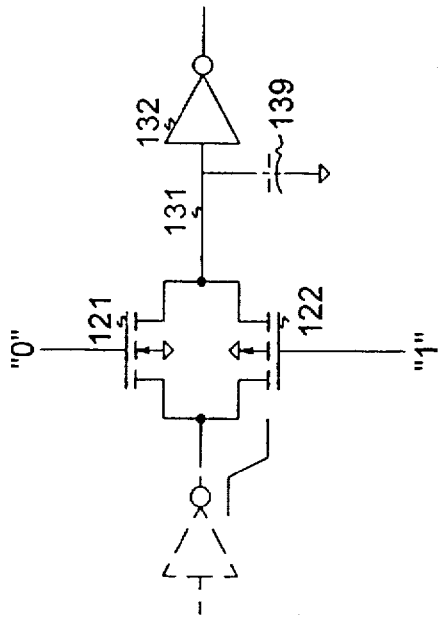
FIG. 5c is a schematic diagram showing an equivalent circuit for the 11→01 input state transition of the circuit in FIG. 2b.
Figure 5D:
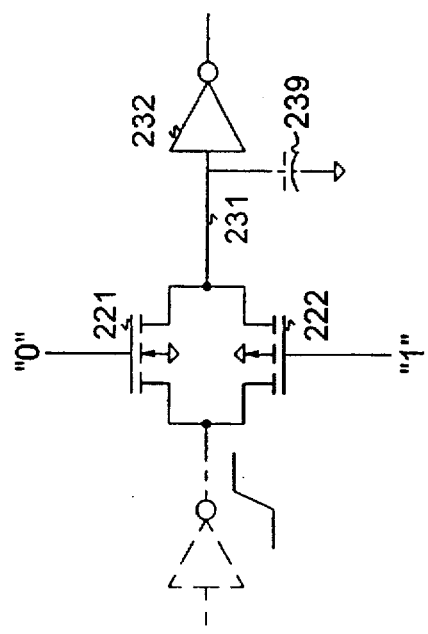
FIG. 5d is a schematic diagram showing an equivalent circuit for the 11→01 input state transition of the circuit in FIG. 2d.
Figure 5E:
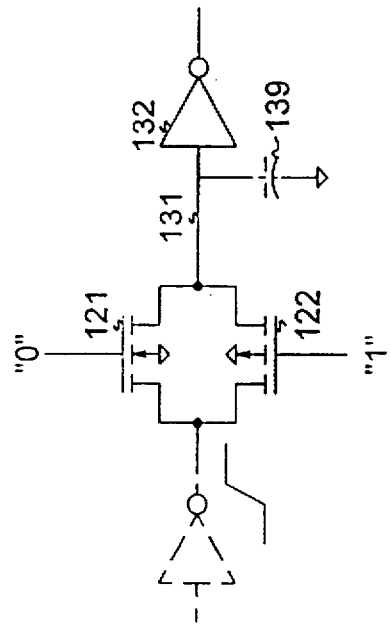
FIG. 5e is a schematic diagram showing an equivalent circuit for the 01→11 input state transition of the circuit in FIG. 2b.
Figure 5F:
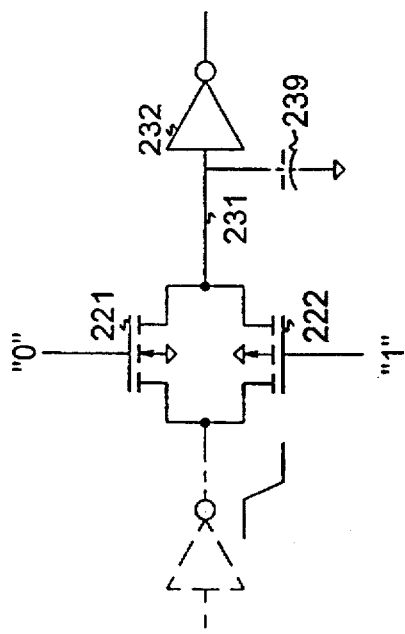
FIG. 5f is a schematic diagram showing an equivalent circuit for the 01→11 input state transition of the circuit in FIG. 2d.
Figure 5H:
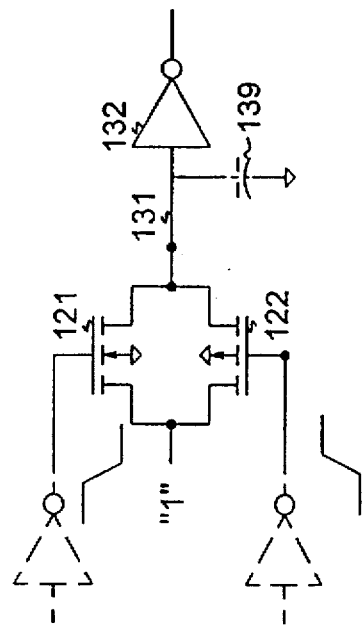
FIG. 5h is a schematic diagram showing an equivalent circuit for the 10→11 input state transition of the circuit in FIG. 2d.
Figure 5G:
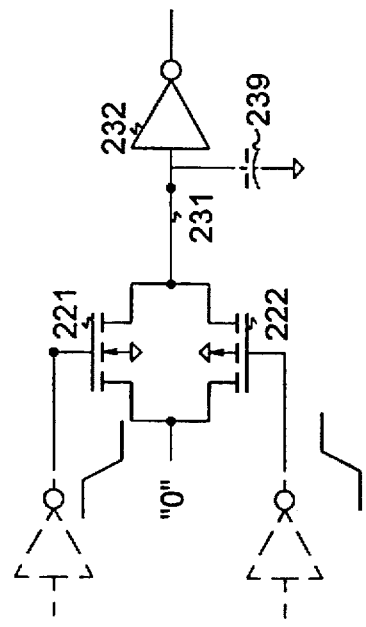
FIG. 5g is a schematic diagram showing an equivalent circuit for the 10→11 input state transition of the circuit in FIG. 2b.
Figure 5J:
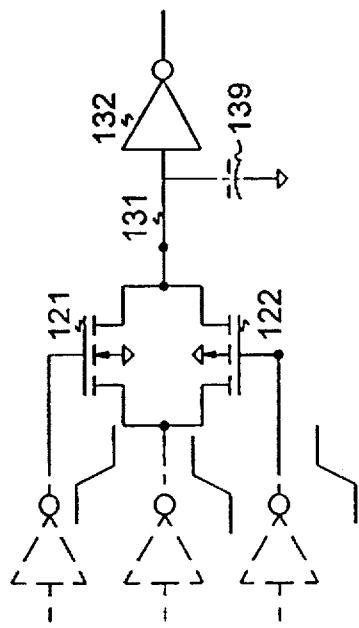
FIG. 5j is a schematic diagram showing an equivalent circuit for the 00→11 input state transition of the circuit in FIG. 2d.
Figure 5I:
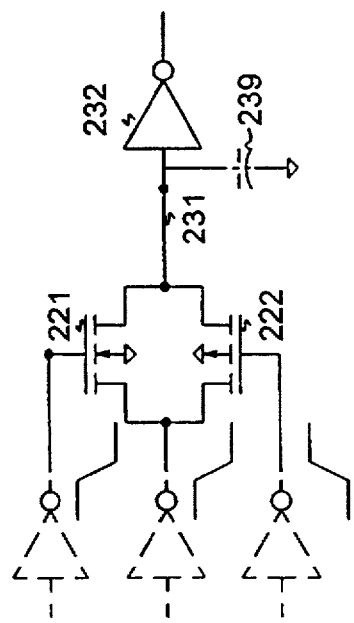
FIG. 5i is a schematic diagram showing an equivalent circuit for the 00→11 input state transition of the circuit in FIG. 2b.

FIG. 5a is a schematic diagram showing an equivalent circuit for the 11→00 and 11→10 input state transitions of the circuit in FIG. 2b. FIG. 5b is a schematic diagram showing an equivalent circuit for the 11→00 and 11→10 input state transitions of the circuit in FIG. 2d. FIG. 5c is a schematic diagram showing an equivalent circuit for the 11→01 input state transition of the circuit in FIG. 2b. FIG. 5d is a schematic diagram showing an equivalent circuit for the 11→01 input state transition of the circuit in FIG. 2d. FIG. 5e is a schematic diagram showing an equivalent circuit for the 01→11 input state transition of the circuit in FIG. 2b. FIG. 5f is a schematic diagram showing an equivalent circuit for the 01→11 input state transition of the circuit in FIG. 2d. FIG. 5g is a schematic diagram showing an equivalent circuit for the 10→11 input state transition of the circuit in FIG. 2b. FIG. 5h is a schematic diagram showing an equivalent circuit for the 10→11 input state transition of the circuit in FIG. 2d. FIG. 5i is a schematic diagram showing an equivalent circuit for the 00→11 input state transition of the circuit in FIG. 2b. FIG. 5j is a schematic diagram showing an equivalent circuit for the 00→11 input state transition of the circuit in FIG. 2d.

The goals in all the cases shown in FIGS. 5a through 5j are to balance the rise and fall times to each other for each output signal; once balanced, these are collectively called the "transition" time for the circuit. Then, the transition time for each circuit is balanced to equal the transition times of all the other circuits, to the greatest extent possible. Similarly, the propagation delay of each circuit must also be made substantially equal to the propagation delays of all the other circuits, to the greatest extent possible. The optimization method is given according to the actual switching behaviors of the circuit:

(a) Pull-down NMOS sizing, (b) Pull-up PMOS sizing, (c) Transmission Gate rise and fall time balancing, and (d) Overall delay balancing.

First, a reference delay is determined for a basic-size pull-down NFET device; thus, a size is chosen for transistor 123 of FIG. 5b, and a simulation of the equivalent circuit of FIG. 5b is run to determine the delay and rise time of that circuit, which is then used as a reference delay. Then, a simulation of FIG. 5a is run and the size of the pull-up PFET device, transistor 224, is determined to ensure the rise time for the pull-up transistor of FIG. 5a equals the fall time for the pull-down transistor in FIG. 5b. For FIGS. 5c, 5d, 5e, 5f, 5g, 5h, 5i, and 5j, the transmission gates are conducting to charge or discharge the 231 and 131 nodes. The optimized ratio of PFET to NFET size is determined in order to get substantially equal rise and fall times for the transmission gates; the size ratio of transistor 221 to transistor 222 will generally be the same as the size ratio of transistor 121 to transistor 122. Then, the whole transmission-gate size is adjusted to balance its delay with that of the appropriate pull-up or pull-down device. Since the parasitic effects are dependent on device size and layout style, the optimization procedure may need several iterations to achieve overall gate delay balance.

In one embodiment, simulations are done using SPICE3, with the circuit netlist file extracted from physical layout (developed using MAGIC) whenever the circuit layout changes. With careful circuit analysis and intensive SPICE simulations of various device sizing, cells with the required properties can be developed.

By performing these steps, the overall delay variations of the WTGL AND/OR gate (with output loading ranging from 0 to 1 pF) are considerably reduced compared to conventional static CFET technology. Similar balancing techniques can be used to minimize overall delay variations for the other circuits of the WTGL family. The result is a set of WTGL basic circuits, each with substantially similar delay and rise/fall times and each having dual-rail outputs, as follows:

(a) a 2-input AND / OR / NAND / NOR circuit (e.g., FIGS. 2f and 2g), (b) a 2-input XOR / XNOR circuit (e.g., FIGS. 3b and 3c), (c) a 2-to-1 MUX circuit (e.g., FIGS. 3e and 3f), and (d) an invertor / non-invertor delay circuit for the interface between single-rail and dual-rail circuits and for inverting or non-inverting types of delay element used as the padding elements (which are adjustable in terms of delay) (e.g., FIGS. 4a and 4b).

As noted above, the circuits for AND/NAND and OR/NOR functions are actually the same, the only difference being the coupling of input signals. A similar convention is applicable for XOR/XNOR and MUX/inverse-MUX functions. For the XOR/XNOR and MUX in FIGS. 3b, 3c, 3d, and 3e, the simulation of equivalent circuits 5c through 5j include all the possible charging and discharging cases with different input-pattern combinations. So the optimization procedure is simpler than that of the AND/OR/NAND/NOR gate described above for FIGS. 2f and 2g. Most importantly, all the basic logic circuits have the same delay properties.

Hence, in contrast to the mere single logic circuit used in other approaches, the present invention provides a family of basic logic circuits which can be used to implement wave-pipelined systems (as shown in FIGS. 2e, 2f, 2g, 3b, 3c, 3d, 3e, 4a, and 4b) and which can be designed to all have substantially the same timing properties.

The dual-rail approach also has certain advantages over other techniques for wave-pipelined design. For instance, in single-rail systems, if the inputs of one logic level require both non-inverted and inverted terms (which is the most common case), and if only NANDs and invertors are available, then one has to insert both an invertor and a delay element to get substantially equally-delayed dual signals. Also, all the other signals at the same logic stage should be delayed by the same amount to keep the timing balance. Such adjustments result in an increase in system delay and layout area. In contrast, the WTGL basic circuit family can generate dual signal outputs simultaneously and the overall timing variation will still be maintained at the same low level.

Every wave-pipelined circuit must have substantially equal delay (balanced) paths under nominal fabrication conditions. Usually tuning is necessary to handle the unbalanced paths and various interconnections of practical circuits. The overall tuning procedure has two steps:

(1) rough tuning, to insert additional delay elements to make all the paths roughly in balance, and (2) fine tuning, to deal with the specific driving requirements of various signal connections, as well as to achieve minimization of power requirements.

For the WTGL circuits, each output signal has a driving invertor which can be fine-tuned separately to balance the delay variations induced by the different fanouts in a practical wave-pipelined circuit.

Recently, a Complementary Pass-transistor Logic (CPL) technique has been used by others to implement a wave-pipelined 8×8 multiplier fabricated in a normal CMOS process. Since the ideal maximum voltage swing at the output of an NMOS pass block is only from 0 to ($V_{DD}-V_{TN}$), the logic threshold voltage of the output invertor must be set accordingly to achieve full output logic swing. Therefore, during the fine-tuning stage, judicious sizing of the entire cell (both the output invertors and the NMOS pass transistors) was needed to adjust the driving ability of the basic circuit. In contrast, with the WTGL basic cells of the invention, the output invertors can be treated as single devices for fine tuning. A WTGL system has high regularity; all the internal signal nodes have, at most, one transistor and one transmission gate connected in series to $V_{DD}$ or ground. Every stage has gate delays of the same magnitude (approximately equivalent to $Td_{invertor}+Td_{TG}$) and each output signal has a separately-adjustable invertor. All of these characteristics are beneficial for practical CAD (Computer-Aided Design) tools development and logic synthesis.

Practical Circuit Design and Comparisons

In order to evaluate and verify the WTGL approach of the invention, several practical circuits have been designed. Since no CAD tools for CMOS wave-pipelined circuit design have been reported, the rough tuning and fine tuning were performed manually.

The results show that for the WTGL technique, since a family of basic circuit cells having the same magnitude of gate delays and reduced delay variations is available, higher speed and more compact practical wave-pipelined circuits can be implemented than can be implemented with other approaches which use only one basic cell (a NAND gate). In addition, the actual circuit-design experience confirms that the high structural regularity and dual-rail signal property of WTGL technique are well suited for wave-pipelined circuit design.

Parallel Carry-Look-Ahead Adder

One of the practical circuits designed was a 16-bit parallel adder. During the adder design, a parallel architecture was adopted. The circuit was modified to take advantage of the special dual-rail characteristics and flexible logic functional choices of WTGL.

The traditional propagation bit $p_i$ and generation bit $g_i$ of the i.th bit are:

$$(g_i, p_i) = (a_i b_i, a_i \text{ XOR } b_i) \quad \{EQ. 2\}$$

$$c_i = G_i \text{ for } i=1, 2, \ldots, n$$

The $G_i$ is defined by an associate operator $\circ$ introduced as follows:

$$(G_i, P_i) = (g_i, p_i) \text{ for } i=1, \text{ and}$$

$$(G_i, P_i) = (g_i, p_i) \circ (G_{i-1}, P_{i-1}) = (g_i + p_i G_{i-1}, p_i P_{i-1}) \text{ for } i>1. \quad \{EQ. 3\}$$

After the carry bit $c_{i-1}$ is computed, the sum bit $s_i$ is obtained by $$s_i = p_i \text{ XOR } c \text{ and } s_i = p_i$$

The logic-circuit block to implement the associate operation defined by equation EQ. 3 is called a Black Processor. If only 2-input NAND gates are available for wave-pipelined circuit design, both the associate operator $\circ$ and the XOR need two logic stages to be implemented. But if equation EQ. 3 is analyzed while considering equation EQ. 2, one obtains:

$$(g_i, p_i) \circ (G_{i-1}, P_{i-1}) = (\overline{p_i} g_i + p_i G_{i-1}, p_i P_{i-1}) \text{ for } i>1.$$

Figure 6:
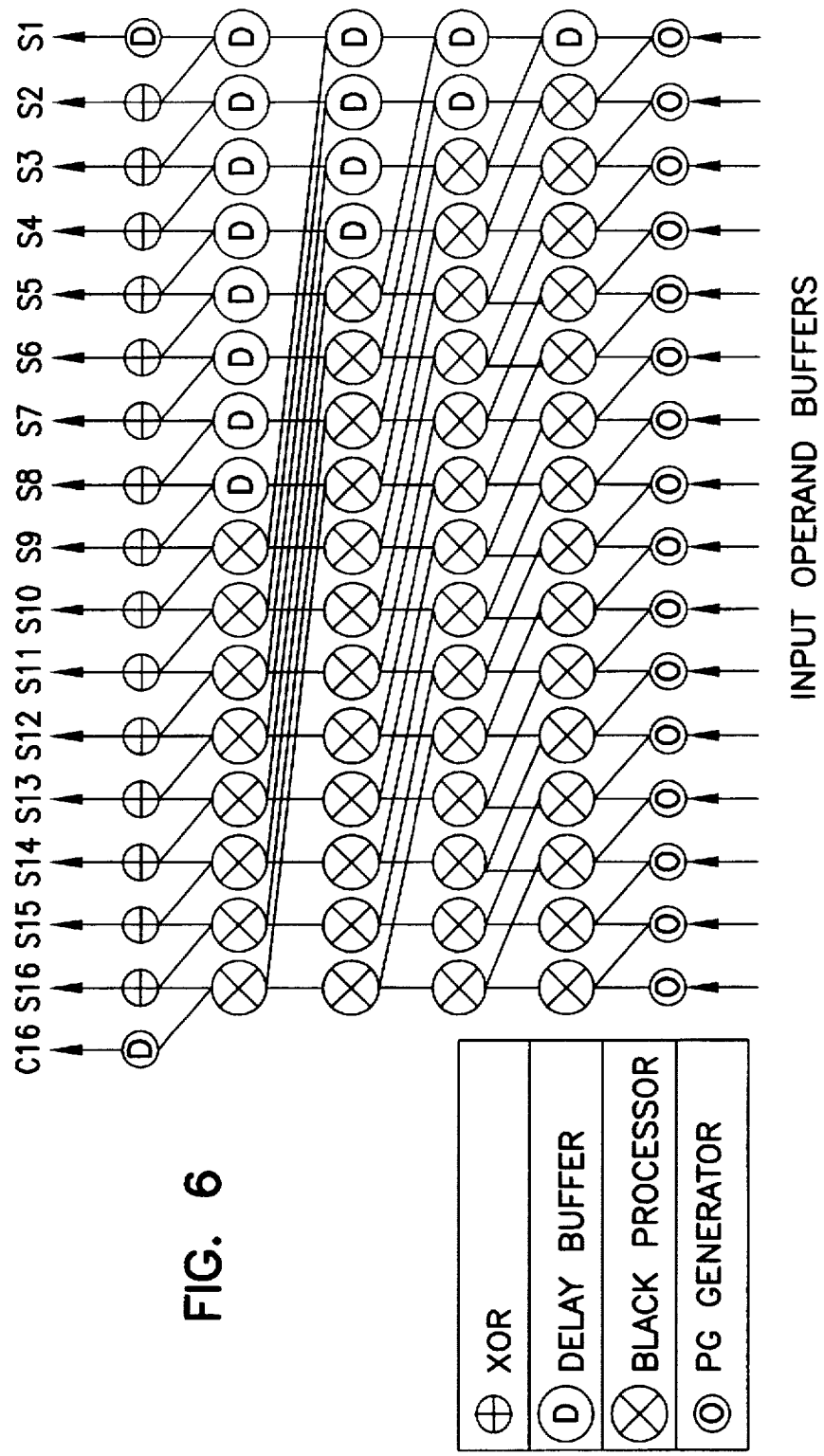
FIG. 6 is a schematic diagram showing a 16-bit carry look-ahead adder implemented with WTGL gates.

The logic function of $G_i$ becomes a single 2-to-1 MUX. Such a logic function is available in the WTGL basic-cell library (e.g., in FIG. 3d) and it has the same gate delays as the XOR and AND/OR gates. Therefore, the Black Processor has exactly one logic stage for both $G_i$ and $P_i$, and thus the total number of logic stages is significantly reduced. The new wave-pipelined adder architecture is shown in FIG. 6. The logic functions of pg generators are described in Equation EQ. 2. The Black Processors produce $G_i$ and $P_i$, as indicated in Equation EQ. 3. In addition, the initial $p_i$ s also need to be latched to the sum stage, along with the carries (the delay latches for $p_i$ s are not explicitly shown in FIG. 6). Since different driving ability is required for some cells, the delay properties of the WTGL cells with different fanouts were simulated, and then the output invertor sizings were fine tuned to balance the delay variations among the inputs of every next-stage cell. Since the adder has a regular architecture, the fine tuning can be easily handled.

Some typical wave-pipelined addition operation sequences were simulated by RSIM. It was found that average delay variation for SUM (the addition result vector) is about 0.9 ns (with SCMOS technology parameters). The delay variations are mainly due to the lack of more accurate and effective CAD tools for fine-tuning and to the intrinsic slight delay variations of the basic circuit cells. The new data waves are latched every 3 ns, so the data-processing speed is 333 million operations per second.

It seems that for dual-rail wave-pipelined circuit design technique, the chip area and number of transistors would increase compared to other single-rail techniques. But the actual layout of the WTGL 16-bit adder is very compact, and the chip size and transistor counts observed using WTGL methods are substantially smaller than those achieved using other methods. (This is because in the methods used by those other researchers, there is only one basic logic circuit—a NAND gate—available.)

Figure 7:
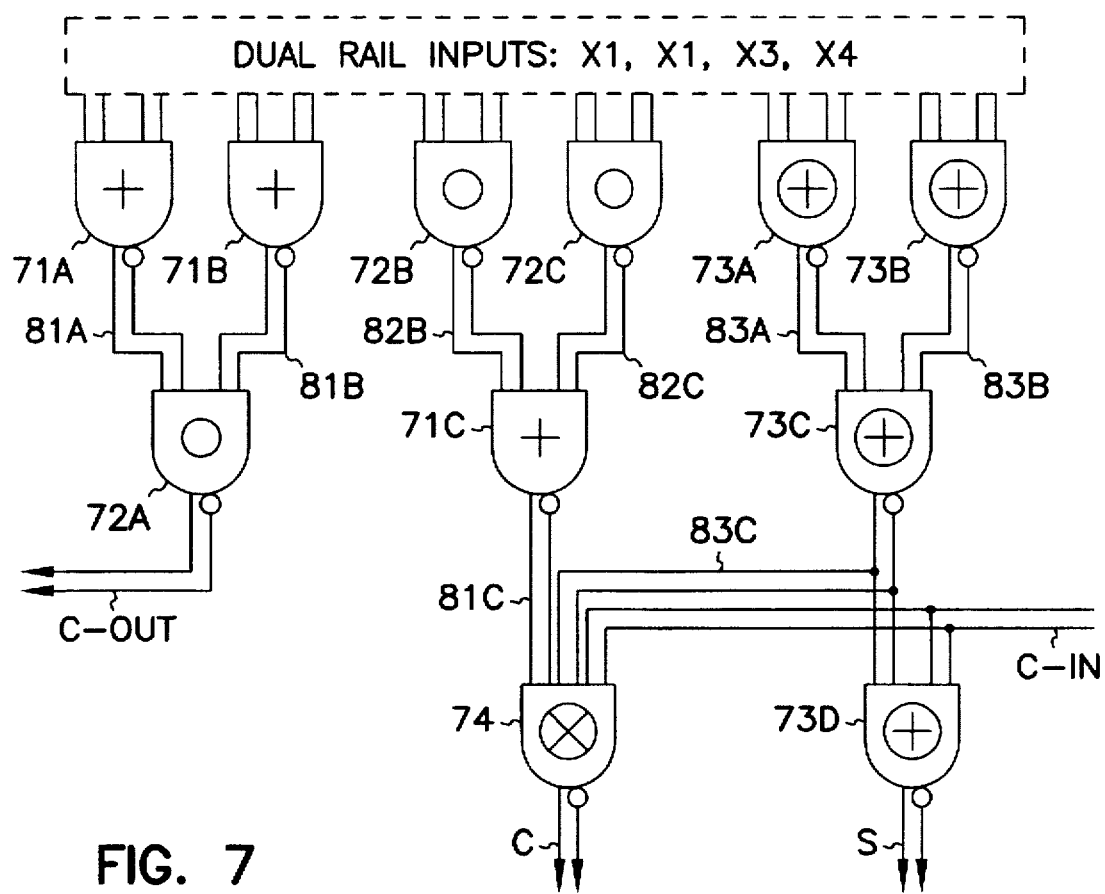
FIG. 7 is a schematic diagram showing a 4:2 compressor circuit implemented with WTGL gates.

Another practical circuit is a macro-cell, the 4:2 compressor, which is the basic building block of a multiplier. FIG. 7 is a schematic circuit diagram of an embodiment of a dual-rail WTGL 4:2 compressor design according to the invention. This WTGL approach takes about 120 transistors, but has a delay of only $3Td_{TG}+3Td_{INV}$. In FIG. 7, OR/NOR gates 71A, 71B, and 71C each comprise a pair of gate circuits: one of the type shown in FIG. 2b wired (as described above) to provide one of the rail polarities, and one of the type shown in FIG. 2d wired to provide the other rail polarity. AND/NAND gates 72A, 72B, and 72C also each comprise a pair of gate circuits: one of the type shown in FIG. 2b to provide one of the rail polarities, and one of the type shown in FIG. 2d to provide the other rail polarity. XOR/XNOR gates 73A, 73B, 73C, and 73D each comprise a pair of gate circuits: one of the type shown in FIG. 3a wired to provide one of the rail polarities as in FIG. 3b, and another also of the type shown in FIG. 3a, but wired to provide the other rail polarity as in FIG. 3c. MUX/inverse-MUX gate 74 comprises a pair of gate circuits: one of the type shown in FIG. 3a wired to provide one of the rail polarities as in FIG. 3d, and another also of the type shown in FIG. 3a, but wired to provide the other rail polarity as in FIG. 3e.

FIG. 7 shows a complementary field-effect transistor 4:2 compressor logic circuit comprising: OR/NOR gate 71A coupled to input signal X1 and input signal X2 and producing OR/NOR signal 81A; OR/NOR gate 71B coupled to input signal X3 and input signal X4 and producing OR/NOR signal 81B; AND/NAND gate 72A coupled to OR/NOR signal 81A and OR/NOR signal 81B and producing a C-OUT signal; AND/NAND gate 72B coupled to input signal X1 and input signal X4 and producing AND/NAND signal 82B; AND/NAND gate 72C coupled to input signal X2 and input signal X3 and producing internal AND/NAND signal 82C; OR/NOR gate 71C coupled to internal AND/NAND signal 82B and internal AND/NAND 82C signal and producing OR/NOR signal 81C; XOR/XNOR gate 73A coupled to input signal X1 and input signal X2 and producing internal XOR/XNOR signal 83A; XOR/XNOR gate 73B coupled to input signal X3 and input signal X4 and producing internal XOR/XNOR signal 83B; XOR/XNOR gate 73C coupled to internal XOR/XNOR signal 83A and internal XOR/XNOR signal 83B and producing internal XOR/XNOR signal 83C; XOR/XNOR gate 73D coupled to internal XOR/XNOR signal 83C and a carry-in signal and producing an S output signal; and MUX/inverse-MUX gate 74 coupled to the carry-in signal and internal OR/NOR signal 81C and selected by internal XOR/XNOR signal 83C and producing a C output signal.

The WTGL design of FIG. 7 has dual-rail inputs and generates dual-rail outputs. A SPICE circuit simulation (using Hewlett Packard 1.0 µm CMOS26 technology parameters shows that the typical WTGL total delay is only 0.52 ns for the circuit of FIG. 7 (which is equivalent to the sum of 3 invertor delays and 3 transmission gate delays), with the total delay variation less than 15%.

Comparisons to other wave-pipeline techniques show that the WTGL approach provides greater speed, as well as a flexible design. In addition, since the WTGL basic cell family is dual-rail and all the logic cells have the same gate delays, the basic cells were used and the routing was performed without inserting any padding elements.

WTGL cell library

The basic cell (SCMOS) library has been implemented, and several experimental circuits have been designed. The research results have revealed that the WTGL circuit family of the invention is suitable for CMOS wave-pipelining design and has certain advantages over other approaches. Currently, several practical circuits are under design and will be fabricated by MOSIS.

Since the possible clocking speed of a wave-pipelined circuit can be as high as several hundred MHz and the frequency value is crucial for the circuit's functionality, on-chip clock-signal generation and manipulation is necessary, and related function modules such as high-frequency flip-flops and shift registers are also needed for wave-pipelined circuits. Currently, single-phase-clocked double-edge-triggered DFF's are being used as the I/O latches of the wave-pipelined functional block, to fully use the clock phases (i.e., both the rising edges and falling edges of the clock are used to clock the latches) and to partially alleviate the specific high-speed-data requirement (the clock speed is half of the data processing speed using this technique).

Logic Synthesis and Tuning Algorithms

Logic synthesis has been studied and explored over the past 30 years. Traditionally, efficient methods for implementing combinational logic in optimal two-level form using PLAs (Programmable-Logic Arrays) have been popular. Multilevel logic synthesis has been used in several systems such as Logic Synthesis System (LSS) and MIS system of the University of California—Berkeley. A widely-accepted optimization criterion is to minimize the physical area while simultaneously satisfying the timing constraints (typically the block maximum and/or minimum delay parameters) derived from a system-level analysis of the chip.

Considering the specific characteristics of the wave-pipelining technique, the conventional area and timing optimization goals are no longer appropriate for most cases. The ideal logic-synthesis algorithms for wave-pipelined systems should implement a certain function with a very high degree of delay balance. Higher degree of balance will result in less total latency variations between different input-output paths measured by basic gate-delay resolution. Actually, for wave-pipelining design, rough-tuning algorithms are needed to modify the circuit to have the highest degree of balance by inserting delay elements, as described in references [Wong:89] and [Wong:93], which are hereby incorporated by reference.

A tuning algorithm has been developed to go along with an ECL/CML wave-pipelined circuit design [Wong:93]. Notice that the rough-tuning algorithm assumes that an arbitrary combinational block is already available for modification, without considering the specific synthesis strategies required for wave-pipelining. It is believed necessary to integrate the logic synthesis and rough-tuning algorithms, since they are closely related in terms of the general optimization goals such as area and timing constraints. In addition, because the WTGL technique has several available basic logic-circuit cells, each with the same gate-delay timing, the logic-synthesis and rough-tuning algorithms using WTGL as target technology would be more efficient. Also, the availability of various basic cells with substantially equal delays necessitates a fresh look at the Boolean minimization problem to effectively utilize the logic blocks which are available using WTGL.

The Binary Decision Diagrams (BDDs) method has been widely used for logic verification and manipulation as described in references [Akers:78] and [Bryant:86], which are hereby incorporated by reference. A more general form, called If-Then-Else Directed Acyclic Graphs (DAGs), has been successfully used for multi-level logic minimization as described in references |Karplus:89| and |Karplus:91|, which are hereby incorporated by reference, with FPGAs as target technology.

All the basic circuit cells of WTGL can be defined by exactly one if-then-else operator:

ab=(if a then b else FALSE)

a+b=(if a then TRUE else b)

a XOR b=(if a then $\overline{b}$ else b)

ac+b$\overline{c}$=(if c then a else b)

In this case, the logic function, as well as the node-timing information measured by basic gate delays, can be represented by if-then-else DAGs. Meanwhile, the rough-tuning algorithms can also use the Directed Acyclic Graph (DAG) representation of circuits, as described in reference |Wong:93|. Therefore, from this common starting point, it would be highly feasible to integrate the logic synthesis and rough tuning to generate more efficient and powerful CAD tools for wave-pipelined circuit implementations with the WTGL basic cell library as target technology.

For the fine-tuning algorithm, the detailed timing analysis of CMOS circuits will be focused upon, especially Transmission-Gate-based circuits. As the equivalent circuits of WTGL basic cells in FIGS. 5a through 5j indicate, the gate delay can be determined by analysis of only a few charge and discharge equivalent circuits. Therefore, simple but effective delay models (which include the fanout information) play a significant role in the development of actual fine-tuning CAD algorithms. In addition, post-layout circuit extraction/simulation procedures should also be incorporated with the fine-tuning CAD tools.

Wave-pipelining using the WTGL circuit family shows enormous potential for high-speed digital-system design. As the research described above has shown, the WTGL family, by providing substantially equal rise and fall times, and reduced input-pattern-caused gate-delay variations, overcomes strict timing constraints often required by other wave-pipelining methods, without sacrificing the basic advantages of the wave-pipelined systems. The analysis on the basic cells of the invention has shown a significant performance improvement over wave-pipelined systems formed by previously described methods.

The WTGL family of basic cells having substantially equal delays allows the development of compact, high-speed circuits through logic synthesis. For instance, the WTGL technique has been shown to be a promising method for high-performance CFET wave-pipelined circuit design. It can be used in applications such as high-speed arithmetic units for high-performance computing systems and high-throughput digital-signal processors for pattern-recognition and image-processing systems. This will surely help in the development of high-speed systems of the future.

It is to be understood that the above description is intended to be illustrative, and not restrictive. Many other embodiments will be apparent to those of skill in the art upon reviewing the above description. For instance, an enhancement-mode Insulated-Gate Field-Effect Transistor (IGFET) technology is used in some of the embodiments (e.g., FIGS. 2b, 2d, and 3) described above, but a person skilled in the art could use an analogous method using, e.g., depletion-mode devices, or MESFETs. The scope of the invention should, therefore, be determined with reference to the appended claims, along with the full scope of equivalents to which such claims are entitled.

References:

[Akers:78] S. Akers, "Binary decision diagrams," IEEE Trans. on Computers, vol. C27, pp. 509–516, June 1978.

[Anderson:67] S. Anderson, J. Earle, R. E. Goldschmidt, and D. M. Powers, "The IBM System/360 Model 91: Floating-Point Execution Unit," IBM J. Research and development, vol. 11, pp. 34–53, January 1967.

[Bryant:86] R. Bryant, "Graph-based algorithms for Boolean function manipulation," IEEE Trans. on Computers, vol. C35, pp. 677–691, August 1986.

[Cotten:69] L. Cotten, "Maximum-rate Pipeline Systems" in AFIPS Proceeding of Spring Joint Computer Conference, pp. 581–586, 1969.

[Ekroot:87] B. Ekroot, "Optimization of Pipelined Processors by Insertion of Combinational Logic Delay," PhD thesis, Stanford University, Dept Elect. Eng., Stanford Univ., Stanford, Calif., September 1987.

[Fan:92] D. Fan, C. Gray, W. Farlow, T. Hughes, W. Liu, and R. Cavin, "A CMOS Parallel Adder Using Wave Pipelining," in Advanced Research in VLSI and Parallel Systems, (MIT, U.S.A.), 1992.

[Gray:91] C. Gray, T. Hughes, S. Arora, W. Liu, and R. Cavin, "Theoretical and Practical Issues in CMOS Wave Pipelining," in VLSI 91, (Edinburgh, U.K.), pp. 397–409, August 1991.

[Joy:91] D. Joy and M. Ciesielski, "Placement for Clock Period Minimization with Multiple Wave Propagation," in 28th ACM/IEEE Design Automation Conference, (San Francisco, Calif.), pp. 640–643, June 1991.

[Karplus:89] K. Karplus, "Using if-then-else DAGs for multi-level logic minimization," in Proc. Advanced Research in VLSI'89, (UC Santa Cruz, Calif.), pp. 101–117, 1989.

[Karplus:91] K. Karplus, "Amap: A technology mapper for selector-based Field-Programmable Gate Arrays," in Proc. 28th Design Automation Conference, 1991.

[Klass:92] F. Klass and J. Mulder, "Use of CMOS technology in Wave Pipelining," in Proc. 5th Conf. VLSI Design, (Bangalore, India), pp. 303–308, January 1992.

[Klass:93a] F. Klass, M. Flynn, and A. V. D. Goor, "Fast Multiplication in VLSI Using Wave Pipelining Techniques," To appear in J. of VLSI Signal Processing.

[Klass:93b] F. Klass, M. Flynn, and A. V. D. Goor, "Pushing the limits of CMOS Technology: A Wave-pipelined Multiplier," in Workshop of Hot Chips V, (Stanford Univ., Calif.), August 1993.

[Lam:92] W. Lam, R Brayton, and A. Sangiovanni-Vincentelli, "Valid Clocking in Wave-pipelined Circuits," in Proceeding of ICCAD'92, (San Diego, Calif.), May 1992.

[Shimohigashi:93] K. Shimohigashi and K. Seki, "Low-Voltage ULSI Design," IEEE Journal of Solid State Circuits, vol. 28, April 1993.

[Weste:93] N. Weste and K. Eshraghian, Principles of CMOS VLSI Design, Addison-Wesley 2nd edition, 1993.

[Wong:89] D. Wong, G. D. Micheli, and M. Flynn, "Inserting Active Delay Elements to Achieve Wave Pipelining," in Proc. Int. Conf CAD'89, (Santa Clara, Calif.), pp. 270–273, 1989.

[Wong:91] D. C. Wong, "Techniques for designing high-performance digital circuits using wave pipelining," PhD thesis, Stanford University, Dept Elect. Eng., Stanford Univ., Stanford, Calif., Aug. 1991.

[Wong:93] D. C. Wong, G. Micheli, and M. Flynn, "Designing High-Performance Digital Circuits Using Wave Pipelining: Algorithms and Practical Experiences," IEEE Tran. CAD of Integrated Circuits and Systems, vol. 12, pp. 25–46, January 1993.

[Yano:90] K. Yano, T. Yamanaka, T. Nishida, M. Saito, K. Shimohigashi, and A. Shimizu, "A 3.8 ns CMOS -b Multiplier Using Complementary Pass-Transistor Logic," IEEE J. Solid-State Circuits, vol. 25, pp. 388–395, April 1990.

[Zhang:93] X. Zhang and R. Sridhar, "CMOS Wave Pipelining Using Complementary Pass-transistor Logic," Submitted to IEEE J. Solid-State Circuits, in review, August 1993.

What is claimed is:

1. A method for designing a field-effect transistor logic circuit that performs a desired logic function and that has a substantially uniform overall gate delay substantially independent of input transition pattern, the method comprising the steps:

forming a map of the desired logic function;

assigning cells of the map into pairs of map cells;

implementing a transmission gate for each one, if any, of the pairs of map cells that has one high value and one low value;

implementing a pull transistor for each one, if any, of the pairs of map cells having values that are equal; and adjusting electrical properties of the pull transistor and/or the transmission gate to provide the substantially uniform overall gate delay substantially independent of input transition pattern.

2. The method according to claim 1, wherein the map is a Karnaugh map.

3. The method according to claim 2, wherein the pairs of cells are pairs of adjacent cells in the Karnaugh map.

4. The method according to claim 1, wherein the step of implementing a pull-up or a pull-down transistor for each one, if any, of the pairs of map cells having values that are equal includes implementing a pull-up transistor if both values are high and implementing a pull-down transistor if both values are low.

5. The method according to claim 2, wherein the step of adjusting electrical properties comprises the steps of:

determining a ratio of N-type transistor size to P-type transistor size of a first transmission gate to ensure substantially equal rise and fall times of the transmission gate; and determining a ratio of the first transmission gate size to the first pull transistor size to ensure substantially equal rise and fall times of the first transmission gate and the first pull transistor.

6. The method according to claim 1, further comprising the steps of:

for the transmission gate, if any,
coupling a first terminal to a first input signal,
coupling a second terminal to a node, and
coupling a gate to a second input signal;

for the pull transistor, if any,
coupling a first terminal to a voltage source,
coupling a second terminal to the node, and
coupling a gate to a third input signal; and implementing a driver coupled to the node, the driver amplifying a voltage, adjusting logic levels, and providing an output signal, wherein each one of a plurality of paths to the output signal from the first input signal, the second input signal and the third input signal, respectively, has substantially equal delays, each one of the paths passing through the driver and one or more of the transmission gate and the pull transistor.

7. The method according to claim 6, wherein the map is a Karnaugh map.

8. The method according to claim 7, wherein the pairs of cells are pairs of adjacent cells in the Karnaugh map.

9. The method according to claim 6, wherein the transmission gate comprises an N-type transistor and a P-type transistor.

10. The method according to claim 6, wherein the step of adjusting electrical properties comprises the steps of:

determining a ratio of N-type transistor size to P-type transistor size of a first transmission gate to ensure substantially equal rise and fall times of the transmission gate; and determining a ratio of the first transmission gate size to the first pull transistor size to ensure substantially equal rise and fall times of the first transmission gate and the first pull transistor.

11. The method according to claim 3, wherein the step of adjusting electrical properties comprises the steps of:

determining a ratio of N-type transistor size to P-type transistor size of a first transmission gate to ensure substantially equal rise and fall times of the transmission gate; and determining a ratio of the first transmission gate size to the first pull transistor size to ensure substantially equal rise and fall times of the first transmission gate and the first pull transistor.

12. The method according to claim 11, further comprising the step of:

providing a size for the first pull transistor.

13. The method according to claim 5, further comprising the step of:

providing a size for the first pull transistor.

14. The method according to claim 10, further comprising the step of:

providing a size for the first pull transistor.

15. The method according to claim 1, further comprising the step of:

analyzing a circuit using a Directed Acyclic Graph (DAG) representation of the circuit.

16. A method for designing a wave-pipelining circuit, the wave-pipelining circuit including a field-effect transistor logic circuit that performs a desired logic function and that has a substantially uniform overall gate delay substantially independent of input transition pattern, the method comprising the steps:

forming a map of the desired logic function;

assigning cells of the map into pairs of cells;

implementing a transmission gate for each one, if any, of the pairs of map cells that has one high value and one low value, and for each transmission gate, if any,
coupling a first terminal to a first input signal,
coupling a second terminal to a node, and
coupling a gate to a second input signal;

implementing a pull transistor for each one, if any, of the pairs of map cells having values that are equal, and for each pull transistor, if any,
coupling a first terminal to a voltage source,
coupling a second terminal to the node, and
coupling a gate to a third input signal;

implementing a driver coupled to the node, the driver amplifying a signal, adjusting logic levels, and providing an output signal; and adjusting electrical properties of the pull transistor and/or the transmission gate to provide the substantially uniform overall gate delay substantially independent of input transition pattern for each one of a plurality of paths to the output signal from the first input signal, the second input signal and the third input signal, respectively, each one of the paths passing through the driver and one or more of the transmission gate and the pull transistor.

17. The method according to claim 16, wherein the map is a Karnaugh map.

18. The method according to claim 17, wherein the pairs of cells are pairs of adjacent cells in the Karnaugh map.

19. The method according to claim 16, wherein the step of implementing a pull-up or a pull-down transistor includes the step of implementing a pull-up transistor if both values are high and implementing a pull-down transistor if both values are low.

20. The method according to claim 18, wherein the transmission gate comprises an N-type transistor and a P-type transistor.

21. A method for designing a complementary field-effect transistor (FET) logic gate circuit having a delay substantially independent of input transition pattern for use in wave pipelining, the circuit having a first pull transistor having a first channel type, and a first transmission gate comprising an N-type FET and a P-type FET, the method comprising the steps:

determining a ratio of N-type FET size to P-type FET size of the first transmission gate to ensure substantially equal rise and fall times of the first transmission gate; and determining a ratio of the first transmission gate size to the first pull transistor size to ensure substantially equal rise and fall times of the transmission gate and the first pull transistor.

22. The method according to claim 21, wherein the complementary FET logic gate circuit further comprises a second pull transistor having a channel type complementary to the first channel type of the first pull transistor, further comprising the step of:

determining a ratio for the second pull transistor size to the first pull transistor size in order to ensure substantially equal rise and fall times of the first and second pull transistors.

23. The method according to claim 21, further comprising the step of:

providing a size for the first pull transistor.

24. The method according to claim 21, wherein the complementary FET logic gate circuit further comprises a second pull transistor having a channel type complementary to the first channel type of the first pull transistor, and a second transmission gate comprising an N-type FET and a P-type FET, further comprising the steps of:

determining a ratio of N-type FET size to P-type FET size of the second transmission gate to ensure substantially equal rise and fall times of the second transmission gate;

determining a ratio of the second transmission gate size to the second pull transistor size to ensure substantially equal rise and fall times of the second transmission gate and the second pull transistor; and determining a ratio for the second pull transistor size to the first pull transistor size in order to ensure substantially equal rise and fall times of the first and second pull transistors.

25. A system for designing a complementary field-effect transistor (FET) logic gate circuit having a delay substantially independent of input transition pattern for use in wave pipelining, the circuit having a first pull transistor having a first channel type, and a first transmission gate comprising an N-type FET and a P-type FET, the system comprising:

means for determining a ratio of N-type FET size to P-type FET size of the first transmission gate to ensure substantially equal rise and fall times of the first transmission gate; and means for determining a ratio of the first transmission gate size to the first pull transistor size to ensure substantially equal rise and fall times of the transmission gate and the first pull transistor.

26. The system according to claim 25, wherein the means for determining a ratio of N-type FET size to P-type FET size of the first transmission gate and the means for determining a ratio of the first transmission gate size to the first pull transistor size each include a SPICE circuit simulator.

27. The system according to claim 25, wherein the complementary FET logic gate circuit further comprises a second pull transistor having a channel type complementary to the first channel type of the first pull transistor, and a second transmission gate comprising an N-type FET and a P-type FET, further comprising:

means for determining a ratio of N-type FET size to P-type FET size of the second transmission gate to ensure substantially equal rise and fall times of the second transmission gate;

means for determining a ratio of the second transmission gate size to the second pull transistor size to ensure substantially equal rise and fall times of the second transmission gate and the second pull transistor; and means for determining a ratio for the second pull transistor size to the first pull transistor size in order to ensure substantially equal rise and fall times of the first and second pull transistors.

28. The system according to claim 25, wherein the complementary FET logic gate circuit further comprises a second transmission gate comprising an N-type FET and a P-type FET, and a third transmission gate comprising an N-type FET and a P-type FET, further comprising:

means for determining a ratio of N-type FET size to P-type FET size of the second transmission gate to ensure substantially equal rise and fall times of the second transmission gate;

means for determining a ratio of N-type FET size to P-type FET size of the second transmission gate to ensure substantially equal rise and fall times of the second transmission gate;

means for determining a ratio of the second transmission gate size to the third transmission gate size to ensure substantially equal rise and fall times of the second and third transmission gates;

means for determining a ratio for the second transmission gate size to the first transmission gate size in order to ensure substantially equal rise and fall times of the first and second transmission gates.

* * * * *